(12) United States Patent
Todorokihara

(10) Patent No.: US 11,075,621 B2
(45) Date of Patent: Jul. 27, 2021

(54) DELAY CIRCUIT, TIME TO DIGITAL CONVERTER, AND A/D CONVERSION CIRCUIT

(71) Applicant: Seiko Epson Corporation, Tokyo (JP)

(72) Inventor: Masayoshi Todorokihara, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/036,177

(22) Filed: Sep. 29, 2020

(65) Prior Publication Data

US 2021/0099163 A1 Apr. 1, 2021

(30) Foreign Application Priority Data

Sep. 30, 2019 (JP) .............................. JP2019-178868

(51) Int. Cl.
| | |
|---|---|
| *H03K 5/14* | (2014.01) |
| *G04F 10/00* | (2006.01) |
| *H03M 1/12* | (2006.01) |

(52) U.S. Cl.
CPC ............. *H03K 5/14* (2013.01); *G04F 10/005* (2013.01); *H03M 1/1245* (2013.01)

(58) Field of Classification Search
CPC ....... H03K 5/14; G04F 10/005; H03M 1/1245
See application file for complete search history.

(56) References Cited

U.S. PATENT DOCUMENTS

| | | | | |
|---|---|---|---|---|
| 8,406,708 | B2* | 3/2013 | Bai | H03F 1/3258 |
| | | | | 455/114.3 |
| 8,494,041 | B1* | 7/2013 | Cheong | H04L 25/0307 |
| | | | | 375/233 |
| 9,525,457 | B1* | 12/2016 | Tucker | H04B 15/06 |
| 9,654,310 | B1* | 5/2017 | Chang | H04L 25/03057 |

(Continued)

FOREIGN PATENT DOCUMENTS

| | | |
|---|---|---|
| GB | 2 296 142 A | 6/1996 |
| JP | H08-297177 A | 11/1996 |
| JP | 2007-158400 A | 6/2007 |

(Continued)

*Primary Examiner* — Brian K Young
(74) *Attorney, Agent, or Firm* — Harness, Dickey & Pierce, P.L.C.

(57) ABSTRACT

A delay circuit includes a state transition section configured to start state transition based on a trigger signal and output state information indicating the internal state and a transition-state acquisition section configured to latch and hold the state information. The state transition section includes a tapped delay line in which a plurality of delay elements are coupled, a logical circuit configured to generate a third signal based on a first signal based on the trigger signal and a second signal, which is an output signal of the delay element, and a synchronous transition section configured to count an edge of the third signal. The state information is having an output signal of the synchronous transition section and an output signal of the tapped delay line. A humming distance of the state information before and after the state transition is 1. A time from when the internal state transitions (Continued)

from a first internal state to a second internal state until when the internal state transitions to the first internal state again is longer than an interval of a time for updating the state information held by the transition-state acquisition section.

6 Claims, 14 Drawing Sheets

(56) References Cited

U.S. PATENT DOCUMENTS

2007/0120723 A1  5/2007  Watanabe
2018/0175840 A1  6/2018  Todorokihara

FOREIGN PATENT DOCUMENTS

| JP | 2010-239304 A | 10/2010 |
| JP | 2016-082301 A | 5/2016 |
| JP | 2018-101869 A | 6/2018 |

* cited by examiner

FIG. 2

| PRESENT STATE | q[2] | q[1] | q[0] | dout | NEXT STATE | |
|---|---|---|---|---|---|---|
| | | | | | CK=0 | CK=1 |
| T0 | 0 | 0 | 0 | 0 | T0 | T1 |
| T1 | 0 | 0 | 1 | 1 | T2 | T1 |
| T2 | 0 | 1 | 1 | 0 | T2 | T3 |
| T3 | 0 | 1 | 0 | 1 | T4 | T3 |
| T4 | 1 | 1 | 0 | 0 | T4 | T5 |
| T5 | 1 | 1 | 1 | 1 | T6 | T5 |
| T6 | 1 | 0 | 1 | 0 | T6 | T7 |
| T7 | 1 | 0 | 0 | 1 | T0 | T7 |

*FIG. 4*

| state No. | D[6] | D[5] | D[4] | D[3] | D[2] | D[1] | D[0] | q[2] | q[1] | q[0] |
|---|---|---|---|---|---|---|---|---|---|---|
| 1  | 1 | 1 | 1 | 1 | 1 | 1 | 1 | 0 | 0 | 0 |
| 2  | 1 | 1 | 1 | 1 | 1 | 1 | 0 | 0 | 0 | 0 |
| 3  | 1 | 1 | 1 | 1 | 1 | 0 | 0 | 0 | 0 | 0 |
| 4  | 1 | 1 | 1 | 1 | 0 | 0 | 0 | 0 | 0 | 0 |
| 5  | 1 | 1 | 1 | 0 | 0 | 0 | 0 | 0 | 0 | 0 |
| 6  | 1 | 1 | 0 | 0 | 0 | 0 | 0 | 0 | 0 | 0 |
| 7  | 1 | 0 | 0 | 0 | 0 | 0 | 0 | 0 | 0 | 0 |
| 8  | 0 | 0 | 0 | 0 | 0 | 0 | 0 | 0 | 0 | 0 |
| 9  | 0 | 0 | 0 | 0 | 0 | 0 | 0 | 0 | 0 | 1 |
| 10 | 0 | 0 | 0 | 0 | 0 | 0 | 1 | 0 | 0 | 1 |
| 11 | 0 | 0 | 0 | 0 | 0 | 1 | 1 | 0 | 0 | 1 |
| 12 | 0 | 0 | 0 | 0 | 1 | 1 | 1 | 0 | 0 | 1 |
| 13 | 0 | 0 | 0 | 1 | 1 | 1 | 1 | 0 | 0 | 1 |
| 14 | 0 | 0 | 1 | 1 | 1 | 1 | 1 | 0 | 0 | 1 |
| 15 | 0 | 1 | 1 | 1 | 1 | 1 | 1 | 0 | 0 | 1 |
| 16 | 1 | 1 | 1 | 1 | 1 | 1 | 1 | 0 | 0 | 1 |
| 17 | 1 | 1 | 1 | 1 | 1 | 1 | 1 | 0 | 1 | 1 |
| 18 | 1 | 1 | 1 | 1 | 1 | 1 | 0 | 0 | 1 | 1 |
| 19 | 1 | 1 | 1 | 1 | 1 | 0 | 0 | 0 | 1 | 1 |
| 20 | 1 | 1 | 1 | 1 | 0 | 0 | 0 | 0 | 1 | 1 |
| 21 | 1 | 1 | 1 | 0 | 0 | 0 | 0 | 0 | 1 | 1 |
| 22 | 1 | 1 | 0 | 0 | 0 | 0 | 0 | 0 | 1 | 1 |
| 23 | 1 | 0 | 0 | 0 | 0 | 0 | 0 | 0 | 1 | 1 |
| 24 | 0 | 0 | 0 | 0 | 0 | 0 | 0 | 0 | 1 | 1 |
| 25 | 0 | 0 | 0 | 0 | 0 | 0 | 0 | 0 | 1 | 0 |
| 26 | 0 | 0 | 0 | 0 | 0 | 0 | 1 | 0 | 1 | 0 |
| 27 | 0 | 0 | 0 | 0 | 0 | 1 | 1 | 0 | 1 | 0 |
| 28 | 0 | 0 | 0 | 0 | 1 | 1 | 1 | 0 | 1 | 0 |
| 29 | 0 | 0 | 0 | 1 | 1 | 1 | 1 | 0 | 1 | 0 |
| 30 | 0 | 0 | 1 | 1 | 1 | 1 | 1 | 0 | 1 | 0 |
| 31 | 0 | 1 | 1 | 1 | 1 | 1 | 1 | 0 | 1 | 0 |
| 32 | 1 | 1 | 1 | 1 | 1 | 1 | 1 | 0 | 1 | 0 |

Rows 1–8: T0
Rows 9–16: T1
Rows 17–24: T2
Rows 25–32: T3

FIG. 5

| state No. | D[6] | D[5] | D[4] | D[3] | D[2] | D[1] | D[0] | q[2] | q[1] | q[0] |
|---|---|---|---|---|---|---|---|---|---|---|
| 33 | 1 | 1 | 1 | 1 | 1 | 1 | 1 | 1 | 1 | 0 |
| 34 | 1 | 1 | 1 | 1 | 1 | 1 | 0 | 1 | 1 | 0 |
| 35 | 1 | 1 | 1 | 1 | 1 | 0 | 0 | 1 | 1 | 0 |
| 36 | 1 | 1 | 1 | 1 | 0 | 0 | 0 | 1 | 1 | 0 |
| 37 | 1 | 1 | 1 | 0 | 0 | 0 | 0 | 1 | 1 | 0 |
| 38 | 1 | 1 | 0 | 0 | 0 | 0 | 0 | 1 | 1 | 0 |
| 39 | 1 | 0 | 0 | 0 | 0 | 0 | 0 | 1 | 1 | 0 |
| 40 | 0 | 0 | 0 | 0 | 0 | 0 | 0 | 1 | 1 | 0 |
| 41 | 0 | 0 | 0 | 0 | 0 | 0 | 0 | 1 | 1 | 1 |
| 42 | 0 | 0 | 0 | 0 | 0 | 0 | 1 | 1 | 1 | 1 |
| 43 | 0 | 0 | 0 | 0 | 0 | 1 | 1 | 1 | 1 | 1 |
| 44 | 0 | 0 | 0 | 0 | 1 | 1 | 1 | 1 | 1 | 1 |
| 45 | 0 | 0 | 0 | 1 | 1 | 1 | 1 | 1 | 1 | 1 |
| 46 | 0 | 0 | 1 | 1 | 1 | 1 | 1 | 1 | 1 | 1 |
| 47 | 0 | 1 | 1 | 1 | 1 | 1 | 1 | 1 | 1 | 1 |
| 48 | 1 | 1 | 1 | 1 | 1 | 1 | 1 | 1 | 1 | 1 |
| 49 | 1 | 1 | 1 | 1 | 1 | 1 | 1 | 1 | 0 | 1 |
| 50 | 1 | 1 | 1 | 1 | 1 | 1 | 0 | 1 | 0 | 1 |
| 51 | 1 | 1 | 1 | 1 | 1 | 0 | 0 | 1 | 0 | 1 |
| 52 | 1 | 1 | 1 | 1 | 0 | 0 | 0 | 1 | 0 | 1 |
| 53 | 1 | 1 | 1 | 0 | 0 | 0 | 0 | 1 | 0 | 1 |
| 54 | 1 | 1 | 0 | 0 | 0 | 0 | 0 | 1 | 0 | 1 |
| 55 | 1 | 0 | 0 | 0 | 0 | 0 | 0 | 1 | 0 | 1 |
| 56 | 0 | 0 | 0 | 0 | 0 | 0 | 0 | 1 | 0 | 1 |
| 57 | 0 | 0 | 0 | 0 | 0 | 0 | 0 | 1 | 0 | 0 |
| 58 | 0 | 0 | 0 | 0 | 0 | 0 | 1 | 1 | 0 | 0 |
| 59 | 0 | 0 | 0 | 0 | 0 | 1 | 1 | 1 | 0 | 0 |
| 60 | 0 | 0 | 0 | 0 | 1 | 1 | 1 | 1 | 0 | 0 |
| 61 | 0 | 0 | 0 | 1 | 1 | 1 | 1 | 1 | 0 | 0 |
| 62 | 0 | 0 | 1 | 1 | 1 | 1 | 1 | 1 | 0 | 0 |
| 63 | 0 | 1 | 1 | 1 | 1 | 1 | 1 | 1 | 0 | 0 |
| 64 | 1 | 1 | 1 | 1 | 1 | 1 | 1 | 1 | 0 | 0 |

Rows 33–40: T4
Rows 41–48: T5
Rows 49–56: T6
Rows 57–64: T7

FIG. 12

| PD | CLK edge No. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| T×1.5 | C0 | 0 | 0 | 4 | 12 | 20 | 29 | 37 | 45 | 54 | 62 | 64 | 64 | 64 | 64 | 64 | 64 |
| | C1 | 0 | 0 | 4 | 8 | 8 | 9 | 8 | 8 | 9 | 8 | 2 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 8 | 24 | 32 | 45 | 48 | 56 | 72 | 72 | 20 | 0 | 0 | 0 | 0 | 0 |
| | DCNT | 0 | 0 | 0 | 8 | 24 | 32 | 45 | 48 | 56 | 72 | 72 | 20 | 0 | 0 | 0 | 0 |
| | TD | 0 | 0 | 0 | 0 | 8 | 32 | 64 | 109 | 157 | 213 | 285 | 357 | 377 | 377 | 377 | 377 |
| T×1.7 | C0 | 0 | 0 | 2 | 10 | 19 | 27 | 35 | 44 | 52 | 60 | 64 | 64 | 64 | 64 | 64 | 64 |
| | C1 | 0 | 0 | 2 | 8 | 9 | 8 | 8 | 9 | 8 | 8 | 4 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 4 | 24 | 36 | 40 | 48 | 63 | 64 | 72 | 40 | 0 | 0 | 0 | 0 | 0 |
| | DCNT | 0 | 0 | 0 | 4 | 24 | 36 | 40 | 48 | 63 | 64 | 72 | 40 | 0 | 0 | 0 | 0 |
| | TD | 0 | 0 | 0 | 0 | 4 | 28 | 64 | 104 | 152 | 215 | 279 | 351 | 391 | 391 | 391 | 391 |
| T×2.7 | C0 | 0 | 0 | 0 | 2 | 10 | 19 | 27 | 35 | 44 | 52 | 60 | 64 | 64 | 64 | 64 | 64 |
| | C1 | 0 | 0 | 0 | 2 | 8 | 9 | 8 | 8 | 9 | 8 | 8 | 4 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 6 | 32 | 45 | 48 | 56 | 72 | 72 | 80 | 44 | 0 | 0 | 0 | 0 |
| | DCNT | 0 | 0 | 0 | 0 | 6 | 32 | 45 | 48 | 56 | 72 | 72 | 80 | 44 | 0 | 0 | 0 |
| | TD | 0 | 0 | 0 | 0 | 0 | 6 | 38 | 83 | 131 | 187 | 259 | 331 | 411 | 455 | 455 | 455 |
| T×3.7 | C0 | 0 | 0 | 0 | 0 | 2 | 10 | 19 | 27 | 35 | 44 | 52 | 60 | 64 | 64 | 64 | 64 |
| | C1 | 0 | 0 | 0 | 0 | 2 | 8 | 9 | 8 | 8 | 9 | 8 | 8 | 4 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 0 | 8 | 40 | 54 | 56 | 64 | 81 | 80 | 88 | 48 | 0 | 0 | 0 |
| | DCNT | 0 | 0 | 0 | 0 | 0 | 8 | 40 | 54 | 56 | 64 | 81 | 80 | 88 | 48 | 0 | 0 |
| | TD | 0 | 0 | 0 | 0 | 0 | 0 | 8 | 48 | 102 | 158 | 222 | 303 | 383 | 471 | 519 | 519 |

FIG. 13

| PD | T×1.5 | T×1.7 | T×2.7 | T×3.7 |
|---|---|---|---|---|
| TD | 377 | 391 | 455 | 519 |
| ΔTD | – | +14 | +64 | +64 |

FIG. 16

| PD | CLK edge No. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| T × 1.5 | C0 | 0 | 0 | 4 | 12 | 20 | 29 | 37 | 45 | 54 | 62 | 70 | 79 | 87 | 95 | 104 | 112 |
| | C1 | 0 | 0 | 4 | 8 | 8 | 9 | 8 | 8 | 9 | 8 | 8 | 9 | 8 | 8 | 9 | 8 |
| | C0' | 0 | 0 | 4 | 12 | 20 | 29 | 37 | 45 | 54 | 62 | 64 | 64 | 64 | 64 | 64 | 64 |
| | C2 | 0 | 0 | 4 | 8 | 8 | 9 | 8 | 8 | 9 | 8 | 2 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 8 | 24 | 32 | 45 | 48 | 56 | 72 | 72 | 20 | 0 | 0 | 0 | 0 | 0 |
| | DCNT | 0 | 0 | 0 | 8 | 24 | 32 | 45 | 48 | 56 | 72 | 72 | 20 | 0 | 0 | 0 | 0 |
| | TD | 0 | 0 | 0 | 0 | 8 | 32 | 64 | 109 | 157 | 213 | 285 | 357 | 377 | 377 | 377 | 377 |
| T × 1.7 | C0 | 0 | 0 | 2 | 10 | 19 | 27 | 35 | 44 | 52 | 60 | 69 | 77 | 85 | 94 | 102 | 110 |
| | C1 | 0 | 0 | 2 | 8 | 9 | 8 | 8 | 9 | 8 | 8 | 9 | 8 | 8 | 9 | 8 | 8 |
| | C0' | 0 | 0 | 2 | 10 | 19 | 27 | 35 | 44 | 52 | 60 | 64 | 64 | 64 | 64 | 64 | 64 |
| | C2 | 0 | 0 | 2 | 8 | 9 | 8 | 8 | 9 | 8 | 8 | 4 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 4 | 24 | 36 | 40 | 48 | 63 | 64 | 72 | 40 | 0 | 0 | 0 | 0 | 0 |
| | DCNT | 0 | 0 | 0 | 4 | 24 | 36 | 40 | 48 | 63 | 64 | 72 | 40 | 0 | 0 | 0 | 0 |
| | TD | 0 | 0 | 0 | 0 | 4 | 28 | 64 | 104 | 152 | 215 | 279 | 351 | 391 | 391 | 391 | 391 |
| T × 2.7 | C0 | 0 | 0 | 0 | 2 | 10 | 19 | 27 | 35 | 44 | 52 | 60 | 69 | 77 | 85 | 94 | 102 |
| | C1 | 0 | 0 | 0 | 2 | 8 | 9 | 8 | 8 | 9 | 8 | 8 | 9 | 8 | 8 | 9 | 8 |
| | C0' | 0 | 0 | 0 | 2 | 10 | 19 | 27 | 35 | 44 | 52 | 60 | 64 | 64 | 64 | 64 | 64 |
| | C2 | 0 | 0 | 0 | 2 | 8 | 9 | 8 | 8 | 9 | 8 | 8 | 4 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 6 | 32 | 45 | 48 | 56 | 72 | 72 | 80 | 44 | 0 | 0 | 0 | 0 |
| | DCNT | 0 | 0 | 0 | 0 | 6 | 32 | 45 | 48 | 56 | 72 | 72 | 80 | 44 | 0 | 0 | 0 |
| | TD | 0 | 0 | 0 | 0 | 0 | 6 | 38 | 83 | 131 | 187 | 259 | 331 | 411 | 455 | 455 | 455 |
| T × 3.7 | C0 | 0 | 0 | 0 | 0 | 2 | 10 | 19 | 27 | 35 | 44 | 52 | 60 | 69 | 77 | 85 | 94 |
| | C1 | 0 | 0 | 0 | 0 | 2 | 8 | 9 | 8 | 8 | 9 | 8 | 8 | 9 | 8 | 8 | 9 |
| | C0' | 0 | 0 | 0 | 0 | 2 | 10 | 19 | 27 | 35 | 44 | 52 | 60 | 64 | 64 | 64 | 64 |
| | C2 | 0 | 0 | 0 | 0 | 2 | 8 | 9 | 8 | 8 | 9 | 8 | 8 | 4 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 0 | 8 | 40 | 54 | 56 | 64 | 81 | 80 | 88 | 48 | 0 | 0 | 0 |
| | DCNT | 0 | 0 | 0 | 0 | 0 | 8 | 40 | 54 | 56 | 64 | 81 | 80 | 88 | 48 | 0 | 0 |
| | TD | 0 | 0 | 0 | 0 | 0 | 0 | 8 | 48 | 102 | 158 | 222 | 303 | 383 | 471 | 519 | 519 |

DELAY CIRCUIT, TIME TO DIGITAL CONVERTER, AND A/D CONVERSION CIRCUIT

The present application is based on, and claims priority from JP Application Serial Number 2019-178868, filed Sep. 30, 2019, the disclosure of which is hereby incorporated by reference herein in its entirety.

BACKGROUND

1. Technical Field

The present disclosure relates to a delay circuit, a time to digital converter, and an A/D conversion circuit.

2. Related Art

JP-A-8-297177 (Patent Literature 1) discloses a time interval measurement circuit to which an input pulse signal representing a time interval in which a cycle is measured is supplied and in which a state of a ring oscillator is latched at an end of the supplied input pulse signal, a "coarse" value for the length of the measured time interval is obtained from a count value recorded by a high-frequency counter, and a "fine" value in a cycle fraction of the ring oscillator is obtained from a latched value. The time interval measurement circuit combines the "coarse" value and the "fine" value to acquire a transition state of the ring oscillator.

However, in the time interval measurement circuit described in Patent Literature 1, the high-frequency counter for acquiring the "coarse" value with respect to the length of the time interval to be measured and the ring oscillator for acquiring the "fine" value of the cycle fraction of the ring oscillator independently operate. Therefore, the time interval measurement circuit is likely to acquire wrong state information from timing for acquiring the transition state because of fluctuation in the count value acquired by the high-frequency counter and oscillation of the ring oscillator. Consequently, there is room for improvement.

SUMMARY

A delay circuit according to an aspect of the present disclosure includes: a state transition section configured to start state transition, in which an internal state transitions, based on a trigger signal and output state information indicating the internal state; and a transition-state acquisition section configured to latch and hold the state information based on a latch signal. The state transition section includes: a tapped delay line in which a plurality of delay elements are coupled; a logical circuit configured to generate a third signal based on a first signal and a second signal; and a synchronous transition section configured to count an edge of the third signal. The first signal is a signal based on the trigger signal. The second signal is any one of signals output from the plurality of delay elements. The state information is having a signal output from the synchronous transition section and a signal output from the tapped delay line. A humming distance of the state information before and after the state transition is 1. A time from when the internal state transitions from a first internal state to a second internal state until when the internal state transitions to the first internal state again is longer than an interval of a time for updating the state information held by the transition-state acquisition section.

A time to digital converter according to another aspect of the present disclosure includes: the delay circuit according to the aspect; and an arithmetic operation section configured to calculate a number of state transition times of the state transition section based on the state information, weight the number of state transition times based on time elapsing, and accumulate the weighted number of state transition times to calculate a time digital value.

In the time to digital converter according to the aspect, when a number of times the internal state of the state transition section transitions exceeds a threshold from when the trigger signal is input to the state transition section until when the transition-state acquisition section latches the state information, the arithmetic operation section may calculate the time digital value assuming that the number of times is the threshold.

In the time to digital converter according to the aspect, the trigger signal may be a first trigger signal, the state information may be first state information, the time digital value may be a first time digital value, the state transition section may start the state transition based on a second trigger signal and output second state information indicating the internal state, the transition-state acquisition section may latch and hold the second state information, and the arithmetic operation section may calculate a number of state transition times of the state transition section based on the second state information, weight the number of state transition times based on time elapsing, and accumulate the weighted number of state transition times to calculate a second time digital value and calculate a difference between the first time digital value and the second time digital value.

An A/D conversion circuit according to another aspect of the present disclosure is an A/D conversion circuit that converts an input analog signal into a digital signal and outputs the digital signal, the A/D conversion circuit including: the time to digital converter according to the aspect; a reference-waveform-signal generator circuit configured to generate a reference waveform signal based on the latch signal; and a comparator configured to compare a voltage of the analog signal and a voltage of the reference waveform signal and output the trigger signal. The A/D conversion circuit outputs the digital signal based on the time digital value calculated by the time to digital converter.

An A/D conversion circuit according to another aspect of the present disclosure is an A/D conversion circuit that converts an input analog signal into a digital signal and outputs the digital signal, the A/D conversion circuit including: the time to digital converter according to the aspect; a sample hold circuit configured to sample and hold a voltage of the analog signal; a reference-waveform-signal generator circuit configured to generate a reference waveform signal based on the latch signal; and a comparator configured to compare a voltage held by the sample hold circuit and a voltage of the reference waveform signal and output the trigger signal. The A/D conversion circuit outputs the digital signal based on the time digital value calculated by the time to digital converter.

BRIEF DESCRIPTION OF THE DRAWINGS

FIG. 2 is a diagram showing a state transition table of a synchronous transition section.

FIG. 4 is a diagram showing an example of a correspondence relation between an internal state and state signals of the state transition section.

FIG. 5 is a diagram showing the example of the correspondence relation between the internal state and the state signals of the state transition section.

FIG. 12 is a diagram showing a relation between a phase difference and a time digital value.

FIG. 13 is a diagram showing a relation between the phase difference and the time digital value.

FIG. 16 is a diagram showing a relation between the phase difference and the time digital value.

DESCRIPTION OF EXEMPLARY EMBODIMENTS

Preferred embodiments of the present disclosure are explained in detail below with reference to the drawings. The embodiments explained below do not unduly limit the content of the present disclosure described in the appended claims. Not all of components explained below are essential constituent elements of the present disclosure.

1. Delay Circuit

1-1. First Embodiment

Figure 1:
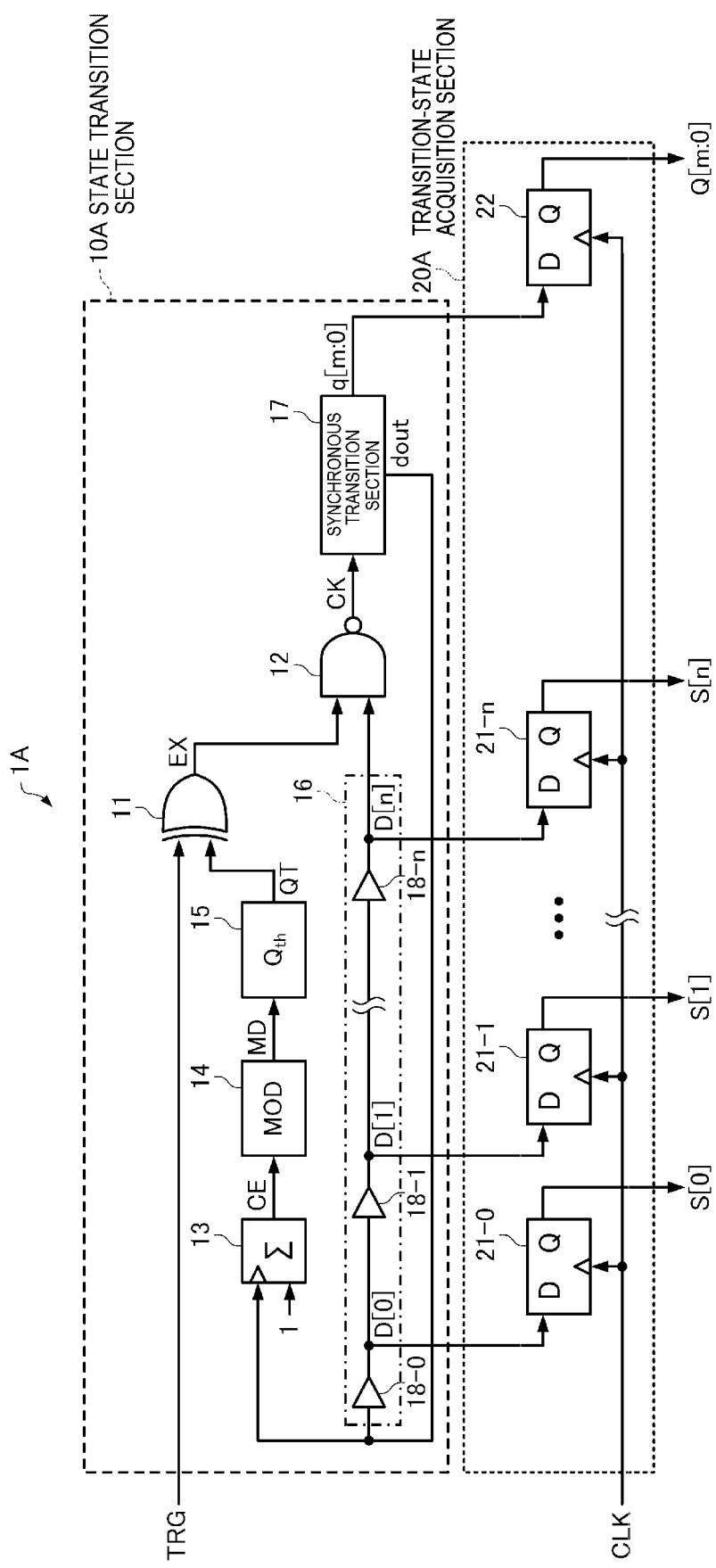
FIG. 1 is a diagram showing the configuration of a delay circuit in a first embodiment.

FIG. 1 is a diagram showing the configuration of a delay circuit in a first embodiment. As shown in FIG. 1, a delay circuit 1A in the first embodiment includes a state transition section 10A and a transition-state acquisition section 20A.

The state transition section 10A starts state transition, in which an internal state transitions, based on a trigger signal TRG and outputs state information indicating the internal state. As shown in FIG. 1, in this embodiment, the state transition section 10A includes an exclusive OR circuit 11, a NOT-AND circuit 12, an accumulator 13, a modulo operator 14, a quantizer 15, a tapped delay line 16, and a synchronous transition section 17.

The exclusive OR circuit 11 outputs an exclusive OR signal EX of the trigger signal TRG and a quantized signal QT output from the quantizer 15. The exclusive OR signal EX is at a high level when a logical level of the trigger signal TRG and a logical level of the quantized signal QT are different and is at a low level when the logical level of the trigger signal TRG and the logical level of the quantized signal QT are the same.

The NOT-AND circuit 12 outputs a clock signal CK, which is a NOT-AND signal of the exclusive OR signal EX and a signal D[n] output from the tapped delay line 16. The clock signal CK is at the low level when both of the exclusive OR signal EX and the signal D[n] are at the high level and is at the high level when at least one of the exclusive OR signal EX and the signal D[n] is at the low level.

The synchronous transition section 17 counts an edge of the clock signal CK. In this embodiment, the synchronous transition section 17 is a state machine, a state of which transitions in synchronization with the clock signal CK. An m+1-bit signal q[m:0] output from the synchronous transition section 17 is a signal indicating the state; m is an integer equal to or larger than 0. Since the state of the synchronous transition section 17 transitions every time the logical level of the clock signal CK is inverted, the signal q[m:0] corresponds to count information of the edge of the clock signal CK. The synchronous transition section 17 outputs a signal dout supplied to an input end of the tapped delay line 16.

In this embodiment, when the state of the synchronous transition section 17 transitions from any state to the next state, only one bit among the m+1 bits of the signal q[m:0] changes. That is, a humming distance of the signal q[m:0] before and after the state transition of the synchronous transition section 17 is 1. For example, the synchronous transition section 17 may be a gray code counter.

A state transition table when the synchronous transition section 17 is the gray code counter and m is 2 is shown in FIG. 2. In FIG. 2 and the following explanation, the low level and the high level are respectively represented as 0 and 1. In an example shown in FIG. 2, the synchronous transition section 17 has eight states of T0 to T7. In the state T0 in which a signal q[2:0] is "000", if the clock signal CK is at the low level, the synchronous transition section 17 maintains the state T0. If the clock signal CK is at the high level, a bit 0 of the signal q[2:0] changes from 0 to 1 and the synchronous transition section 17 transitions to the state T1. In the state T1 in which the signal q[2:0] is "001", if the clock signal CK is at the low level, a bit 1 of the signal q[2:0] changes from 0 to 1 and the synchronous transition section 17 transitions to the state T2. If the clock signal CK is at the high level, the synchronous transition section 17 maintains the state T1. In the state T2 in which the signal q[2:0] is "011", if the clock signal CK is at the low level, the synchronous transition section 17 maintains the state T2. If the clock signal CK is at the high level, the bit 0 of the signal q[2:0] changes from 1 to 0 and the synchronous transition section 17 transitions to the state T3. In the state T3 in which the signal q[2:0] is "010", if the clock signal CK is at the low level, a bit 2 of the signal q[2:0] changes from 0 to 1 and the synchronous transition section 17 transitions to the state T4. If the clock signal CK is at the high level, the synchronous transition section 17 maintains the state T3. In the state T4 in which the signal q[2:0] is "110", if the clock signal CK is at the low level, the synchronous transition section 17 maintains the state T4. If the clock signal CK is at the high level, the bit 0 of the signal q[2:0] changes from 0 to 1 and the synchronous transition section 17 transitions to the state T5. In the state T5 in which the signal q[2:0] is "111", if the clock signal CK is at the low level, the bit 1 of the signal q[2:0] changes from 1 to 0 and the synchronous transition section 17 transitions to the state T6. If the clock signal CK is at the high level, the synchronous transition section 17 maintains the state T5. In the state T6 in which the signal q[2:0] is "101", if the clock signal CK is at the low level, the synchronous transition section 17 maintains the state T6. If the clock signal CK is at the high level, the bit 0 of the signal q[2:0] changes from 1 to 0 and the synchronous transition section 17 transitions to the state T7. In the state T7 in which the signal q[2:0] is "100", if the clock signal CK is at the low level, the bit 2 of the signal q[2:0] changes from 1 to 0 and the synchronous transition section 17 transitions to the state T0. If the clock signal CK is at the high level, the synchronous transition section 17 maintains the state T7.

In the example shown in FIG. 2, after transitioning from the state T0 to the state T7, the synchronous transition section 17 returns to the state T0. However, in all the state transitions, only one bit of the signal q[2:0] changes. Therefore, the humming distance of the signal q[2:0] before and after the state transition of the synchronous transition section 17 is 1.

In the example shown in FIG. 2, the signal dout is 0 in the state T0, the state T2, the state T4, and the state T6 and is 1 in the state T1, the state T3, the state T5, and the state T7. Therefore, a logical level of the signal dout is inverted every time the state transitions.

Referring back to FIG. 1, the accumulator 13 accumulates 1 and outputs an accumulated value CE every time a rising edge of the signal dout occurs. In other words, the accumulator 13 counts the rising edge of the signal dout and outputs the accumulated value CE. The accumulator 13 may count a falling edge of the signal dout.

The modulo operator 14 performs modulo operation with the accumulated value CE as a dividend and with a predetermined value as a divisor. That is, the modulo operator 14 outputs a remainder value MD obtained by dividing the accumulated value CE, which is the dividend, by the predetermined value, which is the divisor. The predetermined value, which is the divisor, is set as appropriate.

The quantizer 15 compares the remainder value MD with a predetermined threshold to thereby output the quantized signal QT obtained by quantizing the remainder value MD. In other words, the quantizer 15 outputs, as the quantized signal QT, a quotient obtained by dividing the remainder value MD, which is the dividend, by the threshold, which is the divisor.

The tapped delay line 16 includes a plurality of delay elements, specifically, n+1 delay elements 18-0 to 18-n; n is an integer equal to or larger than 1. The tapped delay line 16 is a delay line in which the n+1 delay elements 18-0 to 18-n are coupled in a chain shape and includes one input end and n output ends. Such a tapped delay line 16 is called a multistage delay line as well. The delay elements 18-0 to 18-n are respectively buffer elements or logic inversion elements. In the following explanation, it is assumed that all the delay elements 18-0 to 18-n are buffer elements.

An input end of the delay element 18-0 at the head of the tapped delay line 16 is an input end of the tapped delay line 16. Output ends of the respective delay elements 18-0 to 18-n are n output ends of the tapped delay line 16. From the n output ends of the tapped delay line 16, signals D[0] to D[n] are output in order from an input end side of the tapped delay line 16.

The signal dout is input to the input end of the tapped delay line 16. The signal dout changes from the low level to the high level and the signal dout at the high level is propagated through the delay element 18-0, whereby the signal D[0] changes from the low level to the high level. A signal D[i−1] at the high level is propagated through a delay element 18-i, whereby a signal D[i] changes from the low level to the high level; i is any integer equal to or larger than 1 and equal to or smaller than n. That is, signals at the high level are propagated through the delay elements 18-0 to 18-n in order and the signals D[0] to D[n] change from the low level to the high level in order.

Similarly, the signal dout changes from the high level to the low level and the signal dout at the low level is propagated through the delay element 18-0, whereby the signal D[0] changes from the high level to the low level. The signal D[i−1] at the low level is propagated through the delay element 18-i, whereby the signal D[i] changes from the high level to the low level; i is any integer equal to or larger than 1 and equal to or smaller than n. That is, signals at the low level are propagated through the delay elements 18-0 to 18-n in order and the signals D[0] to D[n+1] change from the high level to the low level in order.

Figure 3:
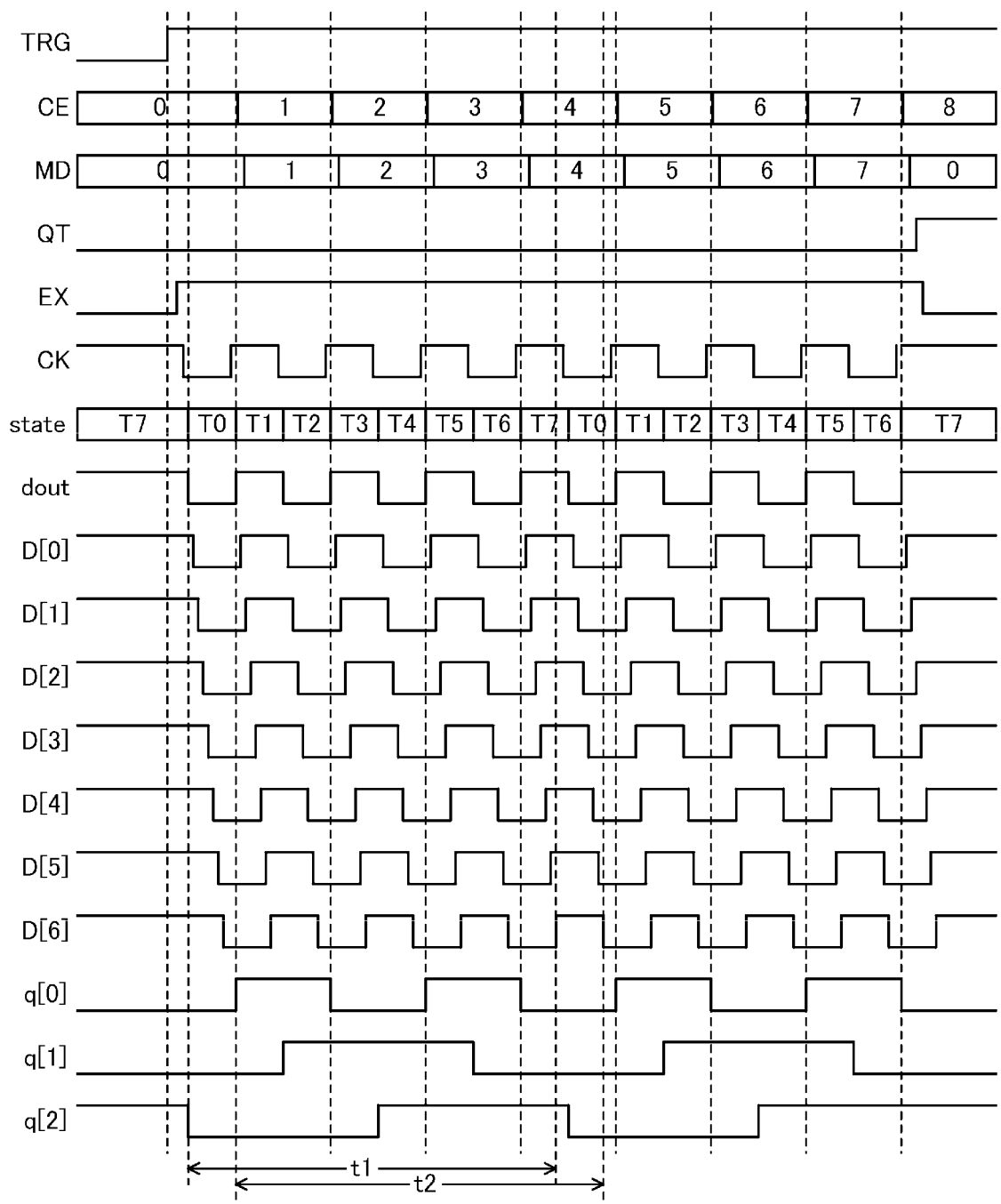
FIG. 3 is a diagram showing an example of waveforms of signals of a state transition section.

FIG. 3 is a diagram showing an example of waveforms of signals of the state transition section 10A. FIG. 3 shows an example in which n is 6, m is 2, and the divisor in the modulo operation by the modulo operator 14 is 16, and the threshold of the quantization by the quantizer 15 is 8.

In the example shown in FIG. 3, when the logical level of the trigger signal TRG changes, the exclusive OR signal EX changes from the low level to the high level and a pulse of the clock signal CK is continuously generated in a period in which the exclusive OR signal EX is at the high level. The accumulated value CE increases by one at every rising edge of the clock signal CK. The remainder value MD increases according to the increase in the accumulated value CE and is initialized to 0 every time the accumulated value CE becomes an integer time of 16. The quantized signal QT is at the low level when the remainder value MD is 7 or less and is at the high level when the remainder value MD is 8 or more. When the logical level of the quantized signal QT changes, the exclusive OR signal EX changes from the high level to the low level and the generation of the pulse of the clock signal CK is stopped.

In the example shown in FIG. 3, every time the logical level of the trigger signal TRG changes, the logical level of the clock signal CK is inverted sixteen times and eight pulse are generated. However, if the divisor in the modulo operation by the modulo operator 14 and the threshold of the quantization by the quantizer 15 are changed, a pulse number of the clock signal CK also changes. For example, when the divisor in the modulo operation by the modulo operator 14 is 2p and the threshold of the quantization by the quantizer 15 is p, every time the logical level of the trigger signal TRG changes, the logical level of the clock signal CK is inverted 2p times and p pulses are generated. Every time the logical level of the clock signal CK changes, a state of the synchronous transition section 17, that is, 1 bit of the signal q[2:0] changes and the logical level of the signal dout also changes. Every time the logical level of the signal dout changes, bits of a signal D[6:0] change in order.

A value of a 10-bit signal having the signal q[2:0] and the signal D[6:0] changes according to elapse of time. Therefore, when an internal state of the state transition section 10A is defined in association with the value of the 10-bit signal, the state transition section 10A starts state transition, in which the internal state transitions, based on the trigger signal TRG and outputs, as state information indicating the internal state, a state signal having the signal q[2:0] output from the synchronous transition section 17 and the signal D[6:0] output from the tapped delay line 16.

FIGS. 4 and 5 are diagrams showing an example of a correspondence relation between the internal state of the state transition section 10A and the signal D[6:0] and the signal q[2:0]. In the example shown in FIGS. 4 and 5, n is 6 and m is 2. In FIGS. 4 and 5 and the following explanation, the low level and the high level are respectively represented as 0 and 1.

As shown in FIG. 4, in a first state, the signal D[6:0] is "1111111" and the signal q[2:0] is "000". The internal state of the state transition section 10A transitions from the first state to a second state. In the second state, the signal D[6:0] is "1111110" and the signal q[2:0] is "000". Similarly, the internal state of the state transition section 10A transitions from the second state to an eighth state in order. In the first state to the eighth state, since the signal q[2:0] is "000", the synchronous transition section 17 is in the state T0. Since bits of 0 increase by one at a time in the signal D[6:0], a low-level signal is propagated in the tapped delay line 16.

The internal state of the state transition section 10A transitions from the eighth state to a ninth state. In the ninth state, the signal D[6:0] is "0000000" and the signal q[2:0] is "001". The internal state of the state transition section 10A transitions from the ninth state to a tenth state. In the tenth state, the signal D[6:0] is "0000001" and the signal q[2:0] is "001". Similarly, the internal state of the state transition section 10A transitions from the tenth state to a sixteenth state in order. In the ninth state to the sixteenth state, since the signal q[2:0] is "001", the synchronous transition section 17 is in the state T1. Since bits of 1 increase by one at a time in the signal D[6:0], a high-level signal is propagated in the tapped delay line 16.

The internal state of the state transition section 10A transitions from the sixteenth state to a seventeenth state. In the seventeenth state, the signal D[6:0] is "1111111" and the signal q[2:0] is "011". The internal state of the state transition section 10A transitions from the seventeenth state to an eighteenth state. In the eighteenth state, the signal D[6:0] is "1111110" and the signal q[2:0] is "011". Similarly, the internal state of the state transition section 10A transitions from the eighteenth state to a twenty-fourth state in order. In the seventeenth state to the twenty-fourth state, since the signal q[2:0] is "011", the synchronous transition section 17 is in the state T2. Since bits of 0 increase by one at a time in the signal D[6:0], a low-level signal is propagated in the tapped delay line 16.

The internal state of the state transition section 10A transitions from the twenty-fourth state to a twenty-fifth state. In the twenty-fifth state, the signal D[6:0] is "0000000" and the signal q[2:0] is "010". The internal state of the state transition section 10A transitions from the twenty-fifth state to a twenty-sixth state. In the twenty-sixth state, the signal D[6:0] is "0000001" and the signal q[2:0] is "010". Similarly, the internal state of the state transition section 10A transitions from the twenty-sixth state to a thirty-second state in order. In the twenty-fifth state to the thirty-second state, since the signal q[2:0] is "010", the synchronous transition section 17 is in the state T3. Since bits of 1 increase by one at a time in the signal D[6:0], a high-level signal is propagated in the tapped delay line 16.

The internal state of the state transition section 10A transitions from the thirty-second state to a thirty-third state. As shown in FIG. 5, in the thirty-third state, the signal D[6:0] is "1111111" and the signal q[2:0] is "110". The internal state of the state transition section 10A transitions from the thirty-third state to a thirty-fourth state. In the thirty-fourth state, the signal D[6:0] is "1111110" and the signal q[2:0] is "110". Similarly, the internal state of the state transition section 10A transitions from the thirty-fourth state to a fortieth state in order. In the thirty-third state to the fortieth state, since the signal q[2:0] is "110", the synchronous transition section 17 is in the state T4. Since bits of 0 increase by one at a time in the signal D[6:0], a low-level signal is propagated in the tapped delay line 16.

The internal state of the state transition section 10A transitions from the fortieth state to a forty-first state. In the forty-first state, the signal D[6:0] is "0000000" and the signal q[2:0] is "111". The internal state of the state transition section 10A transitions from the forty-first state to a forty-second state. In the forty-second state, the signal D[6:0] is "0000001" and the signal q[2:0] is "111". Similarly, the internal state of the state transition section 10A transitions from the forty-second state to a forty-eighth state in order. In the forty-first state to the forty-eighth state, since the signal q[2:0] is "111", the synchronous transition section 17 is in the state T5. Since bits of 1 increase by one at a time in the signal D[6:0], a high-level signal is propagated in the tapped delay line 16.

The internal state of the state transition section 10A transitions from the forty-eighth state to a forty-ninth state. In the forty-ninth state, the signal D[6:0] is "1111111" and the signal q[2:0] is "101". The internal state of the state transition section 10A transitions from the forty-ninth state to a fiftieth state. In the fiftieth state, the signal D[6:0] is "1111110" and the signal q[2:0] is "101". Similarly, the internal state of the state transition section 10A transitions from the fiftieth state to a fifty-sixth state in order. In the forty-ninth state to the fifty-sixth state, since the signal q[2:0] is "101", the synchronous transition section 17 is in the state T6. Since bits of 0 increase by one at a time in the signal D[6:0], a low-level signal is propagated in the tapped delay line 16.

The internal state of the state transition section 10A transitions from the fifty-sixth state to a fifty-seventh state. In the fifty-seventh state, the signal D[6:0] is "0000000" and the signal q[2:0] is "100". The internal state of the state transition section 10A transitions from the fifty-seventh state to a fifty-eighth state. In the fifty-eighth state, the signal D[6:0] is "0000001" and the signal q[2:0] is "100". Similarly, the internal state of the state transition section 10A transitions from the fifty-eighth state to a sixty-fourth state in order. In the fifty-seventh state to the sixty-fourth state, since the signal q[2:0] is "100", the synchronous transition section 17 is in the state T7. Since bits of 1 increase by one at a time in the signal D[6:0], a high-level signal is propagated in the tapped delay line 16.

In the example shown in FIG. 3 explained above, the internal state of the state transition section 10A is the sixty-fourth state when the trigger signal TRG is at the low level. When the trigger signal TRG is at the high level, the internal state of the state transition section 10A transitions from the sixty-fourth state to the next sixty-fourth state and, thereafter, further transitions to the next sixty-fourth state. That is, when the internal state of the state transition section 10A transitions one hundred and twenty-eight times, the state transition section 10A stops the state transition.

Referring back to FIG. 1, the transition-state acquisition section 20A is a latch circuit that latches and holds, based on a latch signal, the state information output by the state transition section 10A. In this embodiment, the latch signal is a clock signal CLK. The state information is a state signal having the signal q[m:0] and a signal D[n:0]. As shown in FIG. 1, in this embodiment, the transition-state acquisition section 20A includes n+1 D flip flops 21-0 to 21-n and an m+1-bit register 22 including m+1 D flip flops.

The respective D flip flops 21-0 to 21-n acquire the respective signals D[0] to D[n] in synchronization with a rising edge of the clock signal CLK and hold signals S[0] to S[n] corresponding to logical levels of the respective signals D[0] to D[n].

The register 22 acquires the signal q[m:0] in synchronization with the rising edge of the clock signal CLK and holds a signal Q[m:0] corresponding to a value of the signal q[2:0].

The transition-state acquisition section 20A configured in this way functions as a latch circuit that latches and holds, at timing of the rising edge of the clock signal CLK, a state signal indicating the internal state of the state transition section 10A. The transition-state acquisition section 20A outputs a state signal having the signal Q[m:0] and a signal S[n:0].

In this embodiment, a time from when the internal state of the state transition section 10A transitions from any first internal state to a second internal state until when the internal state transitions to the first internal state again is longer than an interval of a time for updating the state information held by the transition-state acquisition section 20A. The time until when the internal state transitions to the first internal state again may be considered a time until when the first internal state appears again. The interval of the time for updating the state information held by the transition-state acquisition section 20A is a time of one cycle of the clock signal CLK. For example, in FIGS. 4 and 5, when the first internal state is the sixty-fourth state, the second internal state is the first state. A time from when the internal state of the state transition section 10A transitions from the sixty-fourth state to the first state until when the internal state transitions to the sixty-fourth state again is a time t1 shown in FIG. 3. When the first internal state is the eighth state, the second internal state is the ninth state. A time from when the internal state of the state transition section 10A transitions from the eighth state to the ninth state until when the internal state transitions to the eighth state again is a time t2 shown in FIG. 3. Both of these times t1 and t2 are longer than the time of one cycle of the clock signal CLK. If this condition is satisfied, for example, when the transition-state acquisition section 20A acquires state information indicating the eighth state in synchronization with the rising edge of the clock signal CLK and acquires state information indicating the twenty-fourth state in synchronization with the next rising edge of the clock signal CLK, a circuit at the post stage of the delay circuit 1A can easily calculate the number of transition times of the internal state in the one cycle of the clock signal CLK by calculating 24−16. On the other hand, if the condition is not satisfied, the circuit at the post stage of the delay circuit 1A needs to identify the number of times N the internal state completes a cycle and calculate the number of transition times of the internal state in the one cycle of the clock signal CLK by calculating 24−16+N×64.

In the delay circuit 1A in the first embodiment explained above, as shown in FIGS. 4 and 5, when the internal state of the state transition section 10A transitions from any state to the next state, the state signal having the signal q[m:0] and the signal D[n:0] changes only by one bit. That is, a humming distance of the state information before and after the state transition of the state transition section 10A is 1. Therefore, when transitioning from any state to the next state, the state transition section 10A does not pass through other states. Therefore, even when timing of the rising edge of the clock signal CLK and timing of the state transition of the state transition section 10A substantially coincide, the transition-state acquisition section 20A can latch a state signal corresponding to one of two states before and after the state transition. Therefore, with the delay circuit 1A in the first embodiment, likelihood that the transition-state acquisition section 20A acquires wrong state information is reduced.

In the delay circuit 1A in this first embodiment, the time from when the internal state of the state transition section 10A transitions from any first internal state to a second internal state until when the internal state transitions to the first internal state again is longer than the interval of the time for updating the state information held by the transition-state acquisition section 20A. Therefore, the transition-state acquisition section 20A can acquire a state signal corresponding to the transition state of the state transition section 10A before the state transition of the state transition section 10A completes a cycle. Therefore, with the delay circuit 1A in the first embodiment, the circuit at the post stage of the delay circuit 1A does not need to identify the number of times the internal state of the state transition section 10A completes a cycle from when the transition-state acquisition section 20A acquires a state signal until when the transition-state acquisition section 20A acquires the next state signal. Processing of the circuit can be simplified.

The delay circuit 1A in the first embodiment includes the synchronous transition section 17 that outputs the signal q[m:0] forming a part of the state signal. Therefore, even if the signal D[n:0] output from the tapped delay line 16 has the same value, if a value of the signal q[m:0] is different, the internal state of the state transition section 10A can be treated as a different internal state. Therefore, with the delay circuit 1A in the first embodiment, it is possible to increase the number of internal states of the state transition section 10A without increasing the number of the delay elements 18-0 to 18-n configuring the tapped delay line 16. Therefore, the size of the delay circuit 1A can be reduced.

In this embodiment, the exclusive OR signal EX is a signal based on the trigger signal TRG and is an example of a "first signal". The signal D[n] is at least one of signals output from the plurality of delay elements 18-0 to 18-n and is an example of a "second signal". The clock signal CK is a signal that the NOT-AND circuit 12 generates based on the exclusive OR signal EX and the signal D[n] and is an example of a "third signal". The NOT-AND circuit 12 is an example of a "logical circuit".

1-2. Second Embodiment

Figure 6:
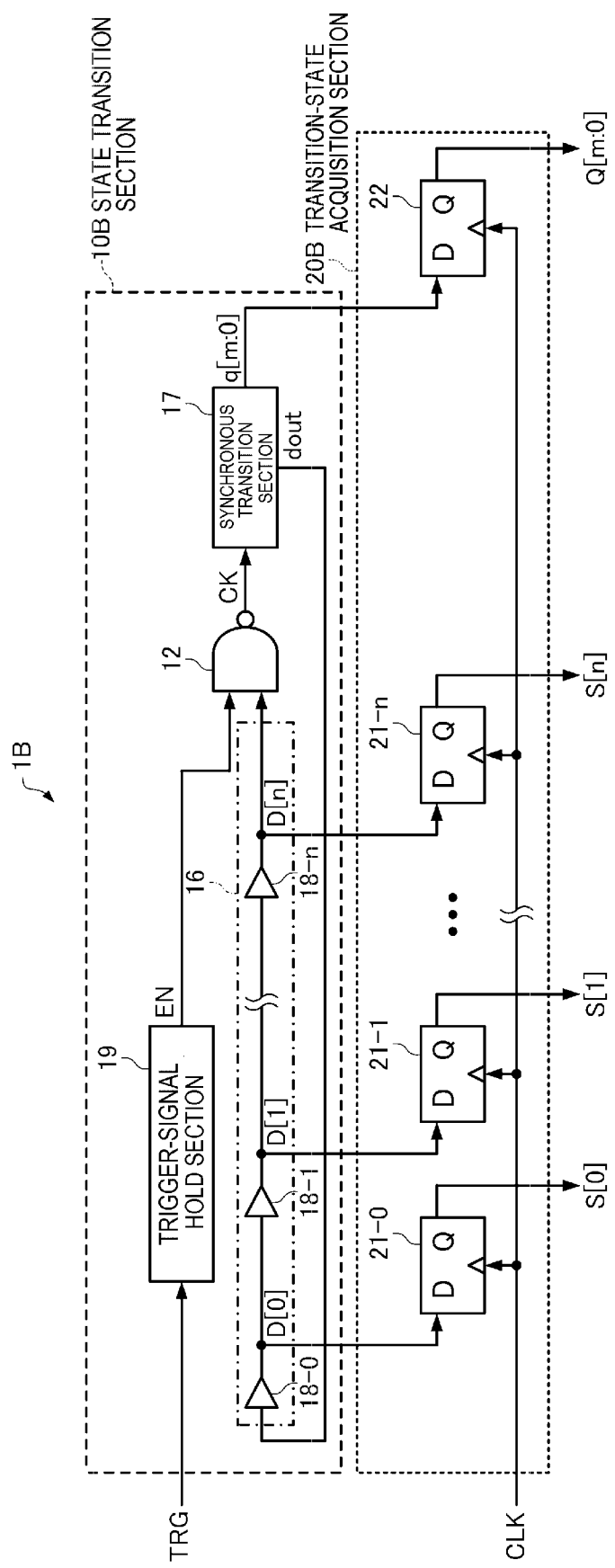
FIG. 6 is a diagram showing the configuration of a delay circuit in a second embodiment.

FIG. 6 is a diagram showing the configuration of a delay circuit in a second embodiment. In FIG. 6, the same components as the components shown in FIG. 1 are denoted by the same reference numerals and signs. As shown in FIG. 6, a delay circuit 1B in the second embodiment includes a state transition section 10B and a transition-state acquisition section 20B.

The state transition section 10B starts state transition, in which an internal state transitions, based on the trigger signal TRG and outputs state information indicating the internal state. As shown in FIG. 6, in this embodiment, the state transition section 10B includes the NOT-AND circuit 12, the tapped delay line 16, the synchronous transition section 17, and a trigger-signal hold section 19.

The trigger-signal hold section 19 holds the trigger signal TRG for a predetermined time and outputs an enable signal EN. Specifically, the trigger-signal hold section 19 sets the enable signal EN to the high level when a logical level of the trigger signal TRG is NOT-AND sets the enable signal EN to the low level when the predetermined time elapses.

The NOT-AND circuit 12 outputs the clock signal CK, which is a NOT-AND signal of the enable signal EN and the signal D[n] output from the tapped delay line 16. The clock signal CK is at the low level when both of the enable signal EN and the signal D[n] are at the high level and is at the high level when at least one of the enable signal EN and the signal D[n] is at the low level.

The synchronous transition section 17 counts an edge of the clock signal CK. In this embodiment, the synchronous transition section 17 is a state machine, a state of which transitions in synchronization with the clock signal CK. The m+1-bit q[m:0] signal output from the synchronous transition section 17 is a signal indicating the state; m is an integer equal to or larger than 0. The state of the synchronous transition section 17 transitions every time a logical level of the clock signal CK is inverted. Therefore, the signal q[m:0] corresponds to count information of the edge of the clock signal CK. The synchronous transition section 17 outputs the signal dout supplied to an input end of the tapped delay line 16. Detailed operation of the synchronous transition section 17 is the same as the detailed operation in the first embodiment. Therefore, explanation of the detailed operation is omitted.

The tapped delay line 16 includes a plurality of delay elements, specifically, the n+1 delay elements 18-0 to 18-*n*; n is an integer equal to or larger than 1. The tapped delay line 16 is a delay line in which the n+1 delay elements 18-0 to 18-*n* are coupled in a chain shape and includes one input end and n output ends. The configuration and the operation of the tapped delay line 16 are the same as the configuration and the operation in the first embodiment. Therefore, explanation of the configuration and the operation is omitted.

Figure 7:
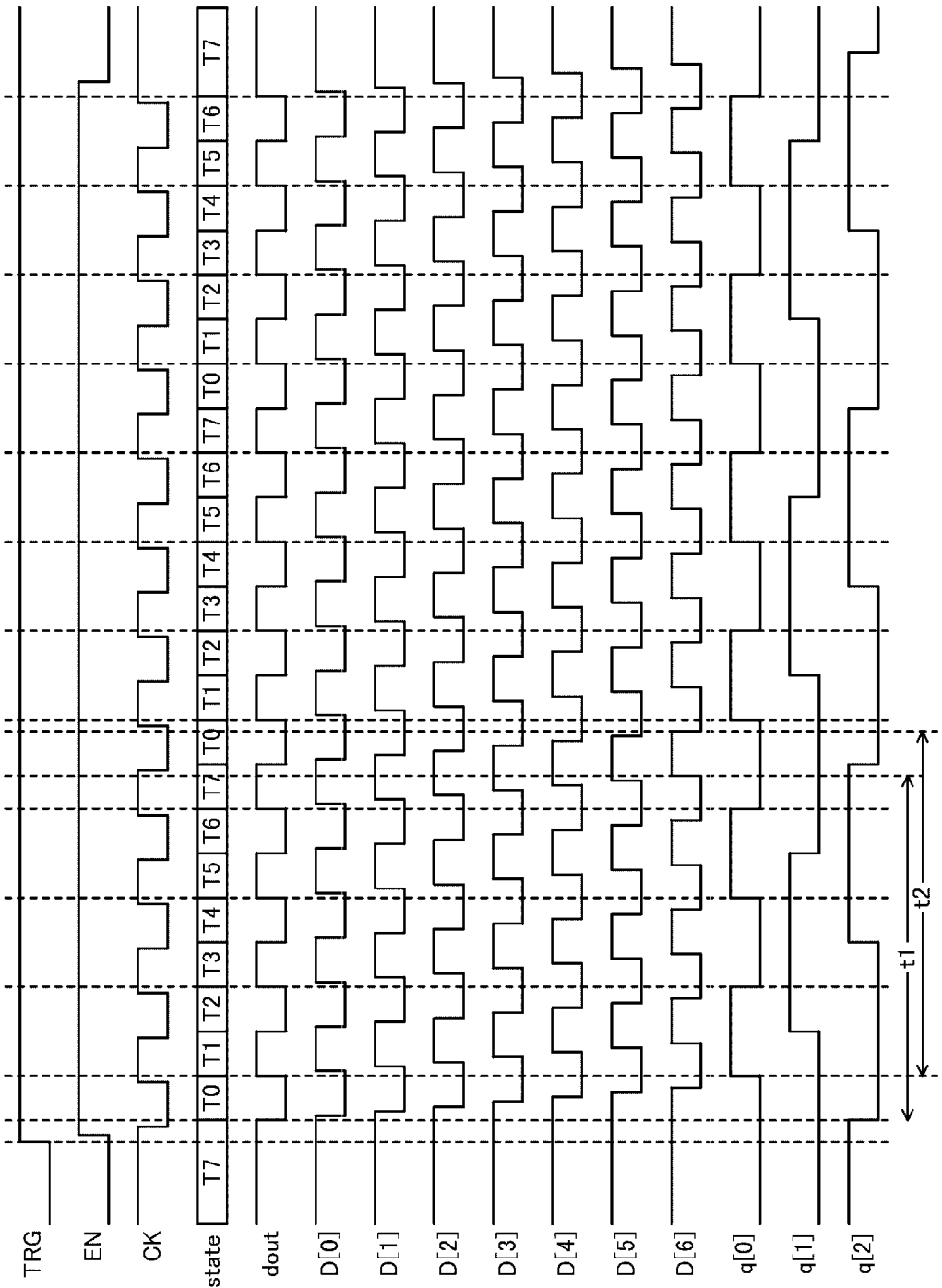
FIG. 7 is a diagram showing an example of waveforms of signals of the state transition section.

FIG. 7 is a diagram showing an example of waveforms of signals of the state transition section 10B. FIG. 7 shows an example in which n is 6 and m is 2.

In the example shown in FIG. 7, when the logical level of the trigger signal TRG changes, the enable signal EN changes from the low level to the high level and a pulse of the clock signal CK is continuously generated in a period in which the enable signal EN is at the high level. When a predetermined time elapses after the enable signal EN changes from the low level to the high level, the enable signal EN changes from the high level to the low level and the generation of the pulse of the clock signal CK is stopped.

In the example shown in FIG. 7, every time the logical level of the trigger signal TRG changes, the logical level of the clock signal CK is inverted twenty-four times and twelve pulse is generated. If setting of the predetermined time in which the enable signal EN maintains the high level is changed, a pulse number of the clock signal CK also changes.

Every time the logical level of the clock signal CK changes, a state of the synchronous transition section 17, that is, 1 bit of the signal q[2:0] changes and a logical level of the signal dout also changes. Every time the logical level of the signal dout changes, bits of the signal D[6:0] change in order.

A value of a 10-bit signal having the signal q[2:0] and the signal D[6:0] changes according to elapse of time. Therefore, when the internal state of the state transition section 10B is defined in association with the value of the 10-bit signal, the state transition section 10B starts state transition, in which the internal state transitions, based on the trigger signal TRG, and outputs, as state information indicating the internal state, a state signal having the signal q[2:0] output from the synchronous transition section 17 and the signal D[6:0] output from the tapped delay line 16.

An example of a correspondence relation between the internal state of the state transition section 10B when n is 6 and m is 2 and the signal D[6:0] and the signal q[2:0] is the same as the example of the correspondence relation shown in FIGS. 4 and 5. Therefore, illustration and explanation of the example of the correspondence relation are omitted.

In the example shown in FIG. 7, the internal state of the state transition section 10B is the sixty-fourth state when the trigger signal TRG is at the low level. When the trigger signal TRG is at the high level, the internal state of the state transition section 10B transitions from the sixty-fourth state to the next sixty-fourth state and, thereafter, further transitions to the next sixty-fourth state and further transitions to the next sixty-fourth state. That is, when the internal state of the state transition section 10B transitions one hundred ninety-two times, the state transition section 10B stops the state transitions.

Referring back to FIG. 6, the transition-state acquisition section 20B is a latch circuit that latches and holds, based on a latch signal, the state information output by the state transition section 10B. In this embodiment, the latch signal is the clock signal CLK. The state information is a state signal having the signal q[m:0] and the signal D[n:0]. As shown in FIG. 6, in this embodiment, the transition-state acquisition section 20B includes the n+1 D flip flops 21-0 to 21-*n* and the m+1-bit register 22 including the m+1 D flip flops.

The respective D flip flops 21-0 to 21-*n* acquire the respective signals D[0] to D[n] in synchronization with the rising edge of the clock signal CLK and hold the signals S[0] to S[n] corresponding to logical levels of the respective signals D[0] to D[n].

The register 22 acquires the signal q[m:0] in synchronization with the rising edge of the clock signal CLK and holds a signal Q[m:0] corresponding to a value of the signal q[2:0].

The transition-state acquisition section 20B configured in this way functions as a latch circuit that latches and holds, at timing of the rising edge of the clock signal CLK, a state signal indicating the internal state of the state transition section 10B. The transition-state acquisition section 20B outputs a state signal having the signal Q[m:0] and the signal S[n:0].

In the second embodiment, as in the first embodiment, a time from when the internal state of the state transition section 10B transitions from any first internal state to a second internal state until when the internal state transitions to the first internal state again is longer than an interval of a time for updating the state information held by the transition-state acquisition section 20B. The time until when the internal state transitions to the first internal state again may be considered a time until when the first internal state appears again. The interval of the time for updating the state information held by the transition-state acquisition section 20B is the time of one cycle of the clock signal CLK. For example, in FIGS. 4 and 5, when the first internal state is the sixty-fourth state, the second internal state is the first state. A time from when the internal state of the state transition section 10B transitions from the sixty-fourth state to the first state until when the internal state transitions to the sixty-fourth state again is a time t1 shown in FIG. 7. When the first internal state is the eighth state, the second internal state is the ninth state. A time from when the internal state of the state transition section 10B transitions from the eighth state to the ninth state until when the internal state transitions to the eighth state again is a time t2 shown in FIG. 7. Both of these times t1 and t2 are longer than the time of one cycle of the clock signal CLK.

In the delay circuit 1B in the second embodiment explained above, as in the delay circuit 1A in the first embodiment, when the internal state of the state transition section 10B transitions from any state to the next state, the state signal having the signal q[m:0] and the signal D[n:0] changes only by one bit. That is, a humming distance of the state information before and after the state transition of the state transition section 10B is 1. Therefore, when transitioning from any state to the next state, the state transition section 10B does not pass through other states. Therefore, even when timing of the rising edge of the clock signal CLK and timing of the state transition of the state transition section 10B substantially coincide, the transition-state acquisition section 20B can latch a state signal corresponding to one of two states before and after the state transition. Therefore, with the delay circuit 1B in the second embodiment, likelihood that the transition-state acquisition section 20B acquires wrong state information is reduced.

In the delay circuit 1B in the second embodiment, as in the delay circuit 1A in this first embodiment, the time from when the internal state of the state transition section 10B transitions from any first internal state to a second internal state until when the internal state transitions to the first internal state again is longer than the interval of the time for updating the state information held by the transition-state acquisition section 20B. Therefore, the transition-state acquisition section 20B can acquire a state signal corresponding to the transition state of the state transition section 10B before the state transition of the state transition section 10B completes a cycle. Therefore, with the delay circuit 1B in the second embodiment, a circuit at the post stage of the delay circuit 1B does not need to identify the number of times the internal state of the state transition section 10B completes a cycle from when the transition-state acquisition section 20B acquires a state signal until when the transition-state acquisition section 20B acquires the next state signal. Processing of the circuit can be simplified.

Like the delay circuit 1A in the first embodiment, the delay circuit 1B in the second embodiment includes the synchronous transition section 17 that outputs the signal q[m:0] forming a part of the state signal. Therefore, even if the signal D[n:0] output from the tapped delay line 16 has the same value, if a value of the signal q[m:0] is different, the internal state of the state transition section 10B can be treated as a different internal state. Therefore, with the delay circuit 1B in the second embodiment, it is possible to increase the number of internal states of the state transition section 10B without increasing the number of the delay elements 18-0 to 18-n configuring the tapped delay line 16. Therefore, the size of the delay circuit 1B can be reduced.

Further, in the delay circuit 1B in the second embodiment, unlike the delay circuit 1A in the first embodiment that stops the state transition with the exclusive OR circuit 11, the accumulator 13, the modulo operator 14, and the quantizer 15 when the number of state transition times of the state transition section 10A reaches an upper limit value, the time in which the state transition section 10B performs the state transition is specified by the enable signal EN generated independently of the number of state transition times by the trigger-signal hold section 19. Therefore, a circuit for stopping the state transition can be simplified.

In this embodiment, the enable signal EN is a signal based on the trigger signal TRG and is an example of the "first signal". The signal D[n] is at least one of signals output from the plurality of delay elements 18-0 to 18-n and is an example of the "second signal". The clock signal CK is a signal that the NOT-AND circuit 12 generates based on the enable signal EX and the signal D[n] and is an example of the "third signal". The NOT-AND circuit 12 is an example of the "logical circuit".

Figure 8:
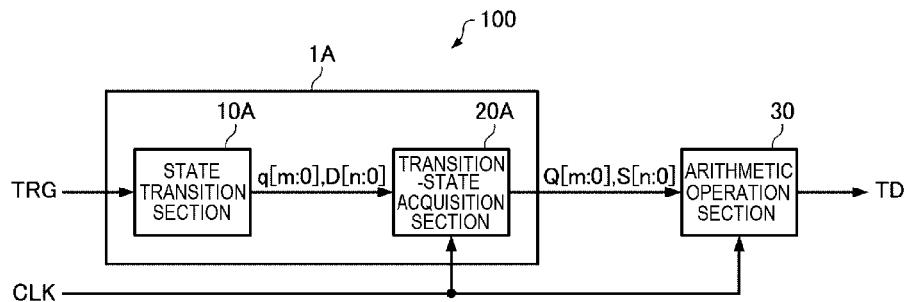
FIG. 8 is a block diagram showing a configuration example of a time to digital converter in the first embodiment.

2. Time to Digital Converter 2-1. First Embodiment 2-1-1. Configuration of a Time to Digital Converter FIG. 8 is a block diagram showing a configuration example of a time to digital converter 100 in the first embodiment. As shown in FIG. 8, the time to digital converter 100 in the first embodiment includes the delay circuit 1A and an arithmetic operation section 30. The delay circuit 1A includes the state transition section 10A and the transition-state acquisition section 20A shown in FIG. 1. The trigger signal TRG and the clock signal CLK are input to the time to digital converter 100. The trigger signal TRG is supplied to the state transition section 10A. The clock signal CLK is supplied to the transition-state acquisition section 20A and the arithmetic operation section 30. The time to digital converter 100 generates a time digital value TD corresponding to a phase difference between a time event of the clock signal CLK and a time event of the trigger signal TRG.

The time event of the trigger signal TRG is timing when the trigger signal TRG changes and, for example, may be a rising edge or a falling edge of the trigger signal TRG or may be the rising edge and the falling edge of the trigger signal TRG. Similarly, the time event of the clock signal CLK is timing when the clock signal CLK changes and, for example, may be a rising edge or a falling edge of the clock signal CLK or may be the rising edge and the falling edge of the clock signal CLK.

In the following explanation, it is assumed that the time event of the trigger signal TRG is the rising edge and the falling edge and the time event of the clock signal CLK is the rising edge.

As explained above, the state transition section 10A starts the state transition, in which the internal state transitions, based on the trigger signal TRG and outputs the state signal having the signal q[m:0] and the signal D[n:0] as the state information indicating the internal state. The transition-state acquisition section 20A acquires and holds, based on the clock signal CLK, the state signal having the signal q[m:0] and the signal D[n:0] output by the state transition section 10A and outputs the state signal having the signal Q[m:0] and the signal S[n:0].

The state signal having the signal Q[m:0] and the signal S[n:0] output from the transition-state acquisition section 20A is input to the arithmetic operation section 30. The arithmetic operation section 30 calculates the number of state transition times of the state transition section 10A based on the state signal having the signal S[n:0] and the signal Q[m:0], weights the number of state transition times based on time elapsing, and accumulates the weighted number of state transition times to calculate the time digital value TD. The arithmetic operation section 30 can be configured by an MPU (Micro Processing Unit), an FPGA (field-programmable gate array), or the like.

2-1-2. Configuration of the Arithmetic Operation Unit

Figure 9:
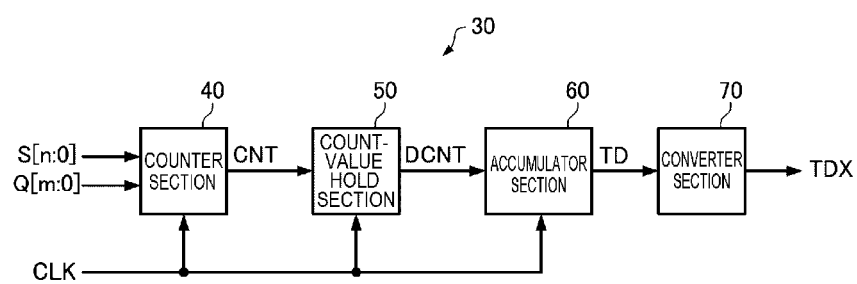
FIG. 9 is a diagram showing a configuration example of an arithmetic operation section.

FIG. 9 is a diagram showing a configuration example of the arithmetic operation section 30. As shown in FIG. 9, the arithmetic operation section 30 includes a counter section 40, a count-value hold section 50, an accumulator section 60, and a converter section 70.

The counter section 40 outputs a count value CNT corresponding to the trigger signal TRG based on the signal Q[m:0] and the signal S[n:0].

The count-value hold section 50 captures the count value CNT output from the counter section 40 and holds the count value CNT as a count value DCNT in synchronization with the clock signal CLK.

The accumulator section 60 accumulates, in synchronization with the clock signal CLK, the count value DCNT held by the count-value hold section 50 to generate the time digital value TD corresponding to phase differences between the time event of the clock signal CLK and respective time events of the trigger signal TRG. The count-value hold section 50 and the accumulator section 60 are initialized when, for example, a not-shown reset signal is input.

The converter section 70 converts the time digital value TD output from the accumulator section 60 into a time digital value TDX. For example, the converter section 70 may perform predetermined scaling on the time digital value TD and convert the time digital value TD into the time digital value TDX or may convert the time digital value TD into the time digital value TDX according to a predetermined conversion formula or table information. The arithmetic operation section 30 may not include the converter section 70.

The time digital value TD or the time digital value TDX calculated by the arithmetic operation section 30 is output to the outside from the time to digital converter 100 via a not-shown terminal.

Figure 10:
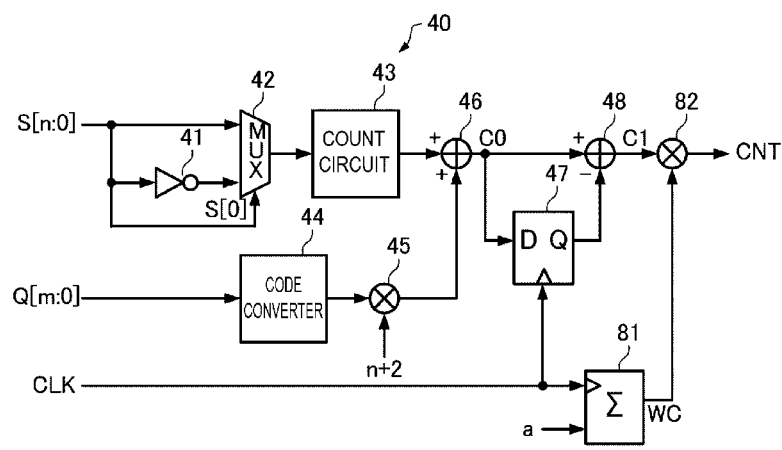
FIG. 10 is a diagram showing a configuration example of a counter section.

FIG. 10 is a diagram showing a configuration example of the counter section 40. The counter section 40 includes a logic inversion circuit 41, a multiplexer 42, a count circuit 43, a code converter 44, a multiplier 45, an adder 46, a register 47, a subtractor 48, an accumulator 81, and a multiplier 82.

The signal S[n:0] and signals obtained by inverting, with the logic inversion circuit 41, logical levels of the signal S[n:0] are input to the multiplexer 42 as two selected signals. A signal S[0], which is a least significant bit of the signal S[n:0], is input to the multiplexer 42 as a selection control signal. The multiplexer 42 selects one of the signal S[n:0] and a logic inverted signal of the signal S[n:0] based on a logical level of the signal S[0] and outputs the selected signal to the count circuit 43. In this embodiment, the multiplexer 42 selects the signal S[n:0] when the signal S[0] is at the low level and selects the logic inverted signal of the signal S[n:0] when the signal S[0] is at the high level.

The count circuit 43 performs population count of the number of low-level bits or the number of high-level bits included in a n+1-bit signal output from the multiplexer 42, generates a signal having a value of any one of 0 to n+1, and outputs the signal to the adder 46. In this embodiment, the count circuit 43 performs population count of the number of high-level bits.

The signal Q[m:0] is input to the code converter 44. The code converter 44 converts the signal Q[m:0] into a signal having a numerical value corresponding to the number of the internal state of the state transition section 10A. For example, in the case of the example shown in FIGS. 4 and 5, the code converter 44 converts the signals Q[2:0] having the values "000", "001", "011", "010", "011", "110", "111", "101", and "100" respectively into signals having values 0, 1, 2, 3, 4, 5, 6, and 7.

The multiplier 45 multiplies the signal output from the code converter 44 by n+2; n+2 is equivalent to the number of state transition times of the internal state of the state transition section 10A at an interval of update of a value of the signal q[m:0]. For example, in the case of n=2, as shown in FIGS. 4 and 5, the number of state transition times of the internal state of the state transition section 10A is 8 at the interval of the update of the value of the signal q[m:0]. Therefore, the multiplier 45 multiplies the signal output from the code converter 44 by 8.

The adder 46 adds up the value of the signal output from the count circuit 43 and the value of the signal output from the multiplier 45. A value of a signal C0 output by the adder 46 is equivalent to the number of times the internal state of the state transition section 10A transitions from when the rising edge or the falling edge of the trigger signal TRG occurs until when the transition-state acquisition section 20A acquires the signal D[n:0].

The register 47 includes a plurality of D flip flops. The register 47 captures and holds, in synchronization with the rising edge of the clock signal CLK, the signal C0 output from the adder 46.

The subtractor 48 subtracts a value of the signal held by the register 47 from a value of the signal C0 output from the adder 46. The value of a signal C1 output from the subtractor 48 is equivalent to the number of time the internal state of the state transition section 10A transitions in a time of the most recent cycle of the clock signal CLK.

The accumulator 81 accumulates a constant value "a" in synchronization with the rising edge of the clock signal CLK. Therefore, the accumulator 81 outputs a weight coefficient signal WC having a value obtained by multiplying a counted value of the rising edge of the clock signal CLK by "a". The value of the weight coefficient signal WC monotonously increases or decreases according to an elapsed time from occurrence of the rising edge or the falling edge of the trigger signal TRG. Specifically, the value of the weight coefficient signal WC monotonously increases according to the elapsed time if the constant value "a" is a positive number and monotonously decreases according to the elapsed time if the constant value "a" is a negative number.

The multiplier 82 multiplies together the value of the signal C1 and the value of the weight coefficient signal WC and obtains the count value CNT. The count value CNT is output from the counter section 40.

Although not shown in FIG. 10 and not explained, a reset signal for initializing the held values to 0 may be input to the register 47 and the accumulator 81, for example, when the number of state transition times of the state transition section 10A reaches the upper limit value or when the state transition of the state transition section 10A stops.

The number of times the internal state of the state transition section 10A transitions in the time of the the most recent cycle of the clock signal CLK is an example of a "number of state transition times". In this embodiment, the number of times the internal state of the state transition section 10A transitions in the time of the the most recent cycle of the clock signal CLK is multiplied by the value of the weight coefficient signal WC to calculate the count value CNT. However, the number of times the internal state of the state transition section 10A transitions from when the trigger signal TRG is input to the time to digital converter 100 until when the transition-state acquisition section 20A acquires the state signal may be multiplied by the value of the weight coefficient signal WC to calculate the count value CNT. That is, the number of transition times is also the "number of state transition times".

Figure 11:
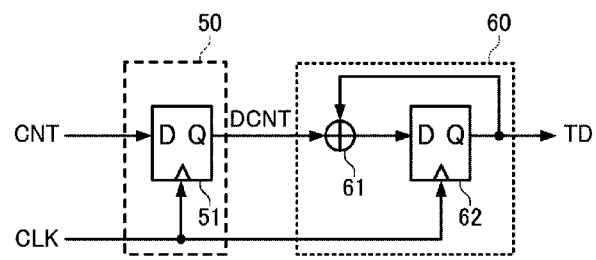
FIG. 11 is a diagram showing a configuration example of a count-value hold section and an accumulator section.

FIG. 11 is a diagram showing a configuration example of the count-value hold section 50 and the accumulator section 60. As shown in FIG. 11, the count-value hold section 50 includes a register 51 including a plurality of D flip flops. The register 51 acquires the count value CNT output from the counter section 40 and holds the count value CNT as the count value DCNT in synchronization with the rising edge of the clock signal CLK.

The accumulator section 60 includes an adder 61 and a register 62 including a plurality of D flip flops. The adder 61 adds up the count value DCNT held by the register 51 and a value output from the register 62. The register 62 captures a value output from the adder 61 and holds the value as the time digital value TD in synchronization with the rising edge of the clock signal CLK.

Although not shown in FIG. 11, reset signals for initializing the held values to 0 may be respectively input to the register 51 and the register 62. Consequently, the time digital value TD is also initialized to 0.

In this embodiment, the time event of the clock signal CLK is set independently from the time event of the trigger signal TRG. That is, the time event of the clock signal CLK and the time event of the trigger signal TRG are asynchronous. The time digital value TD corresponds to a phase difference PD between the time event of the clock signal CLK serving as a reference and the time event of the trigger signal TRG. For example, the time digital value TD or the time digital value TDX is used as a time stamp for the time event of the trigger signal TRG based on the time event of the clock signal CLK.

2-1-3. Relation Between the Phase Difference Between the Clock Signal and the Trigger Signal and the Time Digital Value FIG. 12 is a diagram showing a relation between the phase difference PD between the time event of the clock signal CLK and the time event of the trigger signal TRG and the time digital value TD. In FIG. 12, a value of the signal C0, a value of the signal C1, a value of the weight coefficient signal WC, the count value CNT, and the count value DCNT are also shown. In an example shown in FIG. 12, the upper limit value of the number of state transition times of the state transition section 10A is 64 and the constant value "a" is 1. T represents the time of one cycle of the clock signal CLK.

As shown in FIG. 12, every time the time event of the clock signal CLK occurs, the count value CNT is generated based on the signal C0, the signal C1, and the weight coefficient signal WC. The count value DCNT obtained by holding the count value CNT is accumulated and the time digital value TD increases. Assuming that the time event of the clock signal CLK serving as the reference is a zeroth rising edge, when the phase difference PD is T×1.5, the value of the signal C0 indicating the number of state transition times of the state transition section 10A from the occurrence of the time event of the trigger signal TRG reaches 64, which is the upper limit value, at a tenth rising edge of the clock signal CLK. At twelfth and subsequent rising edges of the clock signal CLK, the time digital value TD is 377.

When the phase difference PD is T×1.7, the value of the signal C0 reaches 64, which is the upper limit value, at the tenth rising edge of the clock signal CLK. At the twelfth and subsequent rising edges of the clock signal CLK, the time digital value TD is 391.

When the phase difference PD is T×2.7, the value of the signal C0 reaches 64, which is the upper limit value, at an eleventh rising edge of the clock signal CLK. At thirteenth and subsequent rising edges of the clock signal CLK, the time digital value TD is 455.

When the phase difference PD is T×3.7, the value of the signal C0 reaches 64, which is the upper limit value, at the twelfth rising edge of the clock signal CLK. At fourteenth and subsequent rising edges of the clock signal CLK, the time digital value TD is 519.

FIG. 13 is a diagram showing a relation between the phase difference PD and the time digital value TD after the number of state transition times of the state transition section 10A reaches the upper limit value in FIG. 12. As shown in FIG. 13, the time digital values TD at time when the phase difference PD is T×1.5, T×1.7, T×2.7, and T×3.7 are respectively 377, 391, 455, and 519. Differential values ΔTD of the time digital value TD are respectively +14, +64, and +64. In the example shown in FIG. 12, since the constant value "a" is a positive number, a value of the weight coefficient signal WC is larger as time further elapses. As the phase difference PD is larger, the number of state transition times of the state transition section 10A reaches 64, which is the upper limit value, later. Therefore, when the phase difference PD increases by the time T of one cycle of the clock signal CLK, the time digital value TD increases by 64, which is the upper limit value of the number of state transition times.

2-1-4. Action Effects

In the time to digital converter 100 in the first embodiment explained above, as explained above, in the delay circuit 1A, the humming distance of the state information before and after the state transition of the state transition section 10A is 1. Therefore, the transition-state acquisition section 20A can latch a state signal corresponding to one of two states before and after the state transition. Therefore, likelihood that the transition-state acquisition section 20A acquires wrong state information is reduced. Therefore, with the time to digital converter 100 in the first embodiment, the time digital value TD can be highly accurately calculated.

In the time to digital converter 100 in the first embodiment, every time the time event of the trigger signal TRG occurs, the counter section 40, the count-value hold section 50, and the accumulator section 60 are not reset and can operate without a dead period in the arithmetic operation section 30. Therefore, a noise shaping effect by delta sigma modulation is efficiently exerted. Therefore, with the time to digital converter 100 in the first embodiment, in the state transition section 10A, a noise component that occurs because of, for example, fluctuation in delay times of the delay elements 18-0 to 18-n shifts to a high-frequency side with the noise shaping effect. Therefore, the time digital value TD with a high S/N ratio can be calculated.

In the time to digital converter 100 in the first embodiment, as explained above, the time from when the internal state of the state transition section 10A transitions from any first internal state to a second internal state until when the internal state transitions to the first internal state again is longer than the interval of the time for updating the state information held by the transition-state acquisition section 20A. Therefore, the transition-state acquisition section 20A can acquire state information corresponding to the transition state of the state transition section 10A before the state transition of the state transition section 10A completes a cycle. Therefore, with the time to digital converter 100 in the first embodiment, the arithmetic operation section 30 does not need to identify the number of times the internal state of the state transition section 10A completes a cycle from when the transition-state acquisition section 20A acquires state information until when the transition-state acquisition section 20A acquires the next state information. Processing of the arithmetic operation section 30 can be simplified.

In the time to digital converter 100 in the first embodiment, as explained above, the delay circuit 1A includes the synchronous transition section 17 that outputs the signal q[m:0] forming a part of the state signal. Therefore, even if the signal D[n:0] output from the tapped delay line 16 has the same value, if a value of the signal q[m:0] is different, the internal state of the state transition section 10A can be treated as a different internal state. Therefore, with the time to digital converter 100 in the first embodiment, it is possible to increase the number of internal states of the state transition section 10A without increasing the number of the delay elements 18-0 to 18-$n$ configuring the tapped delay line 16. Therefore, the size of the delay circuit 1A can be reduced.

2-2. Second Embodiment

Figure 14:
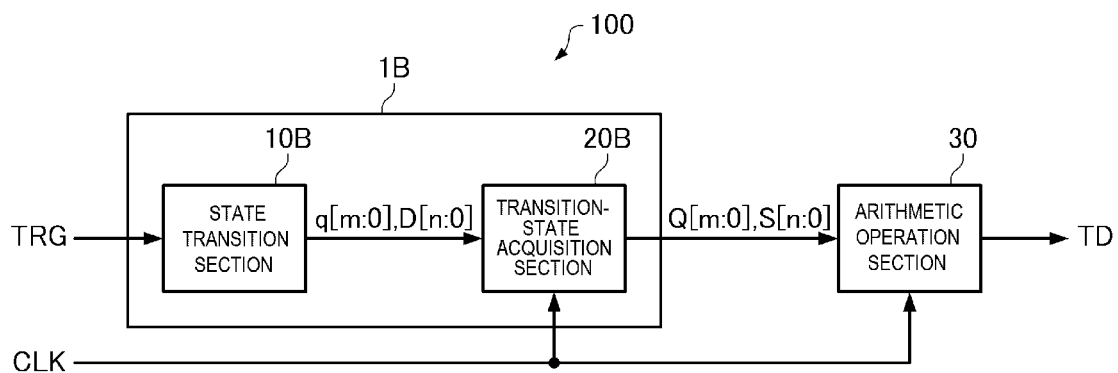
FIG. 14 is a block diagram showing a configuration example of a time to digital converter in the second embodiment.

FIG. 14 is a block diagram showing a configuration example of the time to digital converter 100 in the second embodiment. As shown in FIG. 14, the time to digital converter 100 in the second embodiment includes the delay circuit 1B and the arithmetic operation section 30. The delay circuit 1B includes the state transition section 10B and the transition-state acquisition section 20B shown in FIG. 6. The trigger signal TRG and the clock signal CLK are input to the time to digital converter 100. The trigger signal TRG is supplied to the state transition section 10B. The clock signal CLK is supplied to the transition-state acquisition section 20B and the arithmetic operation section 30. The time to digital converter 100 generates the time digital value TD corresponding to a phase difference between a time event of the clock signal CLK and a time event of the trigger signal TRG.

As explained above, the state transition section 10B starts the state transition, in which the internal state transitions, based on the trigger signal TRG and outputs the state signal having the signal q[m:0] and the signal D[n:0] as the state information indicating the internal state. The transition-state acquisition section 20B acquires and holds, based on the clock signal CLK, the state signal having the signal q[m:0] and the signal D[n:0] output by the state transition section 10B and outputs the state signal having the signal Q[m:0] and the signal S[n:0].

The state signal having signal Q[m:0] and the signal S[n:0] output from the transition-state acquisition section 20B is input to the arithmetic operation section 30. The arithmetic operation section 30 calculates, based on the signal Q[m:0] and the signal S[n:0], the time digital value TD corresponding to the number of transition times of the internal state in the state transition section 10B. However, in the time to digital converter 100 in the second embodiment, unlike the time to digital converter 100 in the first embodiment, when the number of times the internal state of the state transition section 10B exceeds a threshold TH from when the trigger signal TRG is input to the state transition section 10B until when the transition-state acquisition section 20B latches the state signal, the arithmetic operation section 30 calculates the time digital value TD assuming that the number of times is the threshold TH.

Specifically, in the arithmetic operation section 30, the configurations of the count-value hold section 50, the accumulator section 60, and the converter section 70 are the same as the configurations in the time to digital converter 100 in the first embodiment. However, the configuration of the counter section 40 is different from the configuration in the time to digital converter 100 in the first embodiment.

Figure 15:
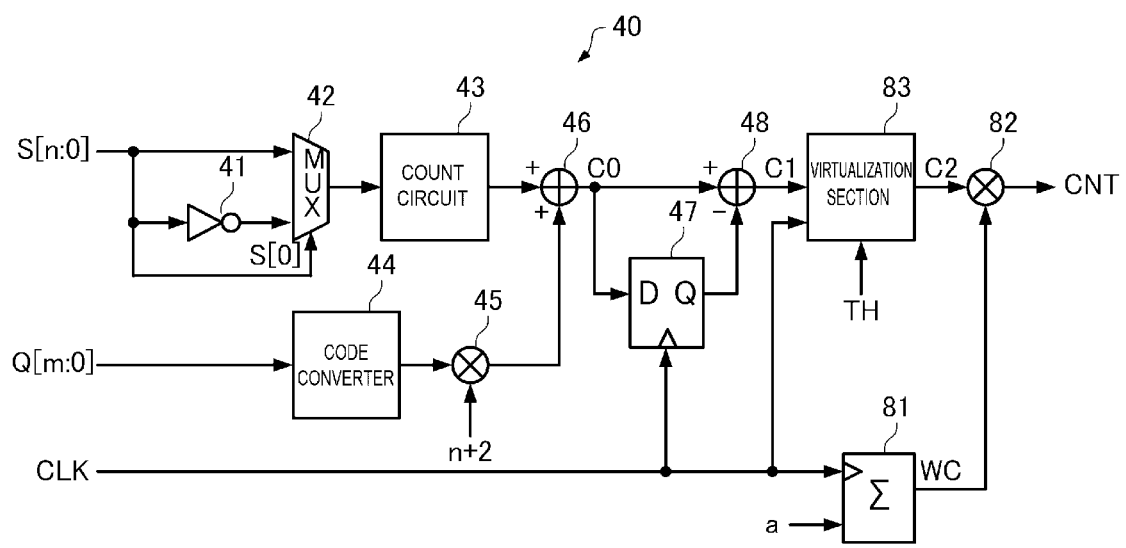
FIG. 15 is a diagram showing a configuration example of the counter section.

FIG. 15 is a diagram showing a configuration example of the counter section 40. The counter section 40 includes the logic inversion circuit 41, the multiplexer 42, the count circuit 43, the code converter 44, the multiplier 45, the adder 46, the register 47, the subtractor 48, the accumulator 81, the multiplier 82, and a virtualization section 83.

The functions of the logic inversion circuit 41, the multiplexer 42, the count circuit 43, the adder 46, the code converter 44, the multiplier 45, the adder 46, the register 47, the subtractor 48, and the accumulator 81 are explained with reference to FIG. 10. Therefore, explanation of the functions is omitted.

The signal C1 output from the subtractor 48 is input to the virtualization section 83. As explained above, a value of the signal C1 output from the subtractor 48 is equivalent to the number of times the internal state of the state transition section 10B transitions in the time of the most recent cycle of the clock signal CLK. The virtualization section 83 accumulates the value of the signal C1 in synchronization with the clock signal CLK to calculate the number of times the internal state of the state transition section 10B transitions from the occurrence of the rising edge or the falling edge of the trigger signal TRG. When the calculated number of times does not exceed the threshold TH, the virtualization section 83 directly virtualizes the signal C0 output by the adder 46 as a signal C0' and outputs a signal C2 equivalent to a differential of the signal C0'. In this case, values of the signal C1 and the signal C2 are equal.

When the calculated number of times exceeds the threshold TH, the virtualization section 83 virtualizes the signal C0 into the signal C0' replacing the threshold TH and outputs the signal C2 equivalent to the differential of the signal C0'. As explained above, the value of the signal C0 is equivalent to the number of times the internal state of the state transition section 10B transitions from when the rising edge or the falling edge of the trigger signal TRG occurs until when the transition-state acquisition section 20A acquires the signal D[n:0].

The multiplier 82 multiplies together the value of the signal C2 output from the virtualization section 83 and the value of the weight coefficient signal WC output from the accumulator 81 to calculate the count value CNT. The count value CNT is output from the counter section 40.

Although not shown and not explained in FIG. 15, for example, when the number of state transition times of the state transition section 10B reaches the upper limit value or when the state transition of the state transition section 10B stops, a reset signal for initializing the held values to 0 may be input to the register 47 and the accumulator 81.

In this embodiment, as in the first embodiment, the number of times the internal state of the state transition section 10B transitions in the time of the the most recent cycle of the clock signal CLK is an example of the "number of state transition times". In this embodiment, as in the first embodiment, the number of times the internal state of the state transition section 10B transitions from when the trigger signal TRG is input to the time to digital converter 100 until when the transition-state acquisition section 20B acquires the state signal may be multiplied by the value of the weight coefficient signal WC to calculate the count value CNT. That is, the number of transition times is also an example of the "number of state transition times".

FIG. 16 is a diagram showing a relation between the phase difference PD between the time event of the clock signal CLK and the time event of the trigger signal TRG and the time digital value TD. In FIG. 16, a value of the signal C0, a value of the signal C1, a value of the signal C0', a value of the signal C2, a value of the weight coefficient signal WC, the count value CNT, and the count value DCNT are also shown. In an example shown in FIG. 16, the threshold TH is 64 and the constant value "a" is 1. T represents the time of one cycle of the clock signal CLK.

As shown in FIG. 16, every time the time event of the clock signal CLK occurs, the signal C0' and the signal C2 are generated based on the signal C0 and the signal C1. Further, the count value CNT is generated based on the signal C2 and the weight coefficient signal WC. The count value DCNT obtained by holding the count value CNT is accumulated and the time digital value TD increases. Assuming that the time event of the clock signal CLK serving as a reference is set as a zeroth rising edge, when the phase difference PD is T×1.5, the value of the signal C0 indicating the number of state transition times of the state transition section 10B from the occurrence of the time event of the trigger signal TRG exceeds 64, which is the threshold TH, at tenth and subsequent rising edges of the clock signal CLK. Therefore, the signal C0' is 64 at the tenth and subsequent edges of the clock signal CLK. The signal C2 is at eleventh and subsequent rising edges of the clock signal CLK. At twelfth and subsequent rising edges of the clock signal CLK, the time digital value TD is 377.

When the phase difference PD is T×1.7, the value of the signal C0 exceeds 64, which is the threshold TH, at the tenth and subsequent rising edges of the clock signal CLK. Therefore, the signal C0' is 64. The signal C2 is 0 at the eleventh and subsequent rising edges of the clock signal CLK. At the twelfth and subsequent rising edges of the clock signal CLK, the time digital value TD is 391.

When the phase difference PD is T×2.7, the value of the signal C0 exceeds 64, which is the threshold TH, at the eleventh and subsequent rising edges of the clock signal CLK. Therefore, the signal C0' is 64. The signal C2 is 0 at the twelfth and subsequent rising edges of the clock signal CLK. At the thirteenth and subsequent rising edges of the clock signal CLK, the time digital value TD is 455.

When the phase difference PD is T×3.7, the value of the signal C0 exceeds 64, which is the threshold TH, at the twelfth and subsequent rising edges of the clock signal CLK. Therefore, the signal C0' is 64. The signal C2 is 0 at the thirteenth and subsequent rising edges of the clock signal CLK. At fourteenth and subsequent rising edges of the clock signal CLK, the time digital value TD is 519.

When FIG. 16 and FIG. 12 are compared, the time digital value TD is the same in all the cases in which the phase difference PD is T×1.5, T×1.7, T×2.7, and T×3.7. Therefore, in the time to digital converter 100 in the second embodiment, as shown in FIG. 13, the differential values ΔTD of the time digital value TD are respectively +14, +64, and +64. When the phase difference PD increases by the time T of one cycle of the clock signal CLK, the time digital value TD increases by 64, which is the threshold TH.

In the time to digital converter 100 in the second embodiment explained above, as explained above, in the delay circuit 1B, the humming distance of the state information before and after the state transition of the state transition section 10B is 1. Therefore, the transition-state acquisition section 20B can latch a state signal corresponding to one of two states before and after the state transition. Therefore, likelihood that the transition-state acquisition section 20B acquires wrong state information is reduced. Therefore, with the time to digital converter 100 in the second embodiment, the time digital value TD can be highly accurately calculated.

In the time to digital converter 100 in the second embodiment, every time the time event of the trigger signal TRG occurs, the counter section 40, the count-value hold section 50, and the accumulator section 60 are not reset and can operate without a dead period in the arithmetic operation section 30. Therefore, a noise shaping effect by delta sigma modulation is efficiently exerted. Therefore, with the time to digital converter 100 in the second embodiment, in the state transition section 10B, a noise component that occurs because of, for example, fluctuation in delay times of the delay elements 18-0 to 18-$n$ shifts to a high-frequency side with the noise shaping effect. Therefore, the time digital value TD with a high S/N ratio can be calculated.

In the time to digital converter 100 in the second embodiment, as explained above, the time from when the internal state of the state transition section 10B transitions from any first internal state to a second internal state until when the internal state transitions to the first internal state again is longer than the interval of the time for updating the state information held by the transition-state acquisition section 20B. Therefore, the transition-state acquisition section 20B can acquire state information corresponding to the transition state of the state transition section 10B before the state transition of the state transition section 10B completes a cycle. Therefore, with the time to digital converter 100 in the second embodiment, the arithmetic operation section 30 does not need to identify the number of times the internal state of the state transition section 10B completes a cycle from when the transition-state acquisition section 20B acquires state information until when the transition-state acquisition section 20B acquires the next state information. Processing of the arithmetic operation section 30 can be simplified.

In the time to digital converter 100 in the second embodiment, as explained above, the delay circuit 1B includes the synchronous transition section 17 that outputs the signal q[m:0] forming a part of the state signal. Therefore, even if the signal D[n:0] output from the tapped delay line 16 has the same value, if a value of the signal q[m:0] is different, the internal state of the state transition section 10B can be treated as a different internal state. Therefore, with the time to digital converter 100 in the second embodiment, it is possible to increase the number of internal states of the state transition section 10B without increasing the number of the delay elements 18-0 to 18-$n$ configuring the tapped delay line 16. Therefore, the size of the delay circuit 1B can be reduced.

Further, in the time to digital converter 100 in the second embodiment, as explained above, unlike the time to digital converter 100 in the first embodiment in which the delay circuit 1A stops the state transition when the number of state transition times of the state transition section 10A reaches the upper limit value, in the delay circuit 1B, the time in which the state transition section 10B performs the state transition is specified by the enable signal EN generated independently of the number of state transition times by the trigger-signal hold section 19. Therefore, a circuit for stopping the state transition can be simplified.

Figure 17:
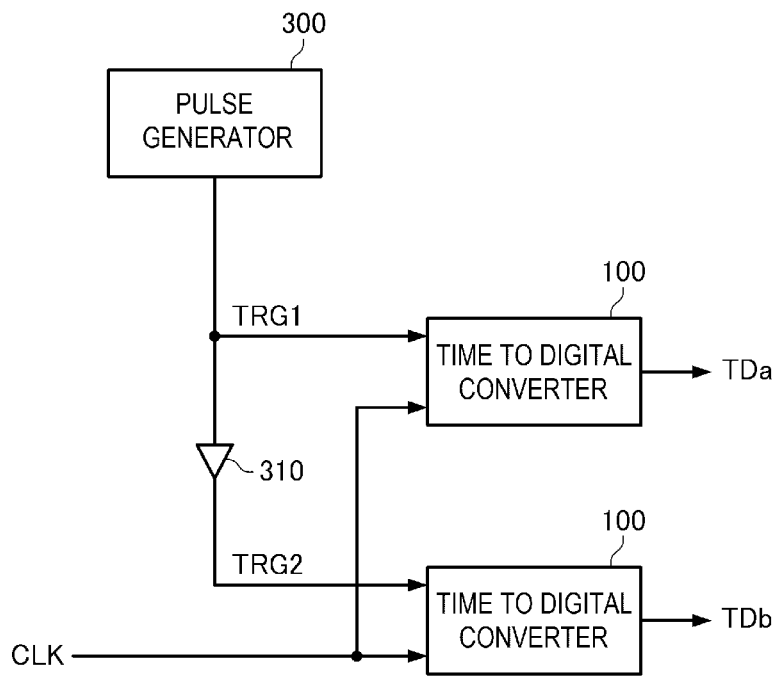
FIG. 17 is a diagram showing a test configuration for explaining effects of the time to digital converter in the second embodiment.

FIG. 17 is a diagram showing a test configuration for evaluating effects of the time to digital converter 100 in the second embodiment. In the test configuration, two time to digital converters 100 are used. A common clock signal CLK is input to the two time to digital converters 100. A trigger signal TRG1 output from a pulse generator 300 is input to one time to digital converter 100. A trigger signal TRG2 obtained by delaying the trigger signal TRG1 through a delay element 310 is input to the other time to digital converter 100. One time to digital converter 100 outputs a time digital value TDa corresponding to a phase difference between the time event of the clock signal CLK and a time event of the trigger signal TRG1. The other time to digital converter 100 outputs a time digital value TDb corresponding to a phase difference between the time event of the clock signal CLK and a time event of the trigger signal TRG2.

Figure 18:
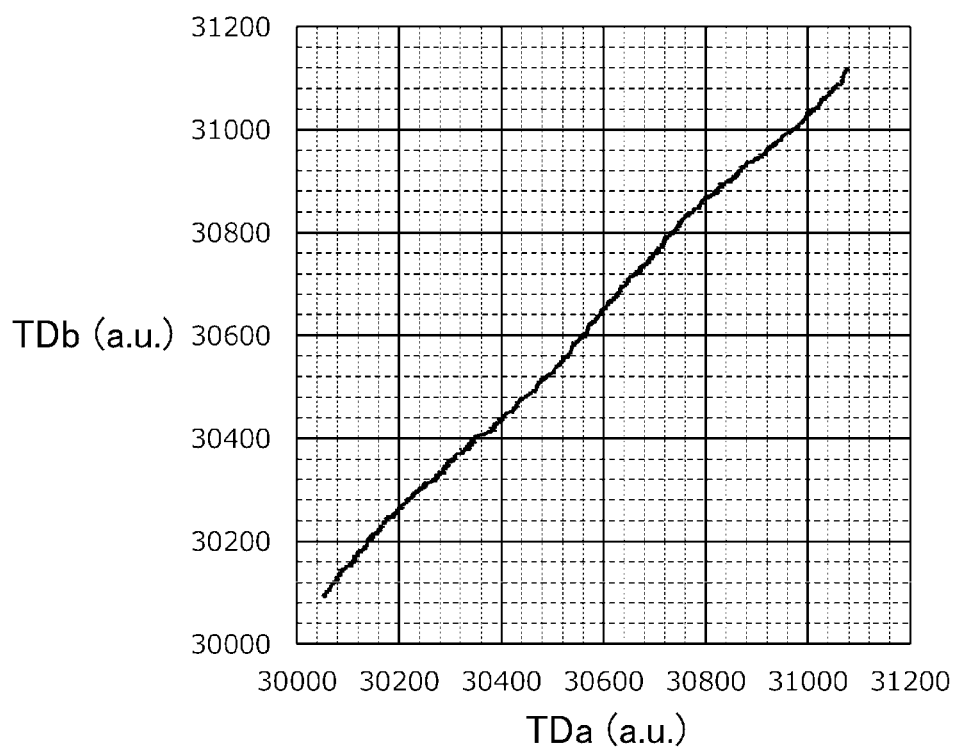
FIG. 18 is a diagram showing a relation between a time digital value TDa and a time digital value TDb.

FIG. 18 is a diagram showing a relation between the time digital value TDa and the time digital value TDb. A frequency of the clock signal CLK was set to 310 MHz, a frequency of the clock signal CK in the state transition section 10B was set to 2.5 GHz ±0.5%, the number of transition times required for the internal state to complete a cycle was set to 64, and the threshold TH of the virtualization section 83 was set to 1024, logic levels of the trigger signals TRG1 and TRG2 were inverted 32768 times respectively, and the time digital values TDa and TDb in a period of 256 cycles of the clock signal CLK were measured 32768 times. In this embodiment, the actual number of state transition times of the state transition section 10B is approximately 1500 times. However, the time digital values TDa and TDb are calculated assuming that the state transition stops virtually when the number of the state transitions reaches 1024. As shown in FIG. 18, the time digital value TDb and the time digital value TDa are distributed in a linear shape having a tilt of 1. A difference between the time digital value TDb and the time digital value TDa is a value corresponding to a delay time of the delay element 310. In this way, the time to digital converter 100 in the second embodiment is a time to digital converter of a weighted ΔΣ, count value accumulation type that weights, with time, a differential of the number of state transition times of the state transition section 10B and accumulates the differential to thereby generate the time digital value TD. A noise shaping effect by delta-sigma modulation is efficiently exerted. The time digital value TD with a high S/N ratio can be obtained.

When the effects of the time to digital converter 100 in the first embodiment are evaluated using the test configuration shown in FIG. 17, theoretically, a relation between the time digital value TDa and the time digital value TDb is as shown in FIG. 18.

2-3. Third Embodiment

Figure 19:
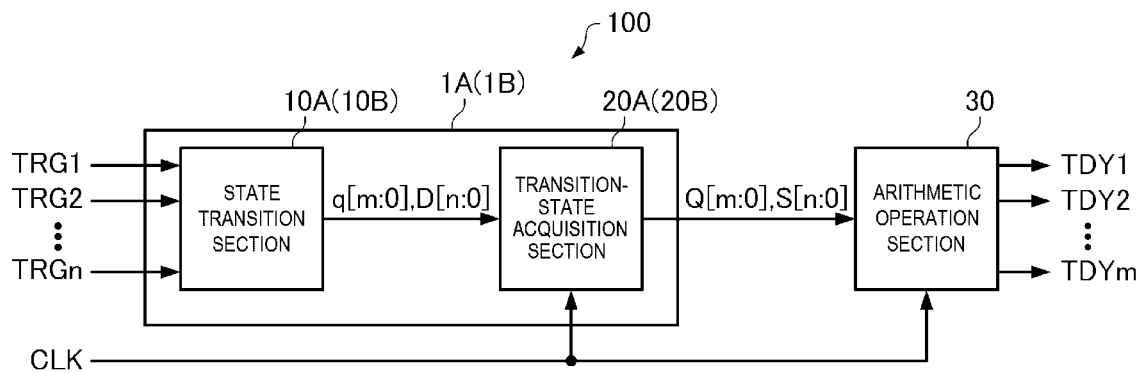
FIG. 19 is a block diagram showing a configuration example of a time to digital converter in a third embodiment.

FIG. 19 is a block diagram showing a configuration example of the time to digital converter 100 in a third embodiment. As shown in FIG. 19, the time to digital converter 100 in the third embodiment includes the delay circuit 1A or the delay circuit 1B and the arithmetic operation section 30. The delay circuit 1A includes the state transition section 10B and the transition-state acquisition section 20B shown in FIG. 1. The delay circuit 1B includes the state transition section 10B and the transition-state acquisition section 20B.

To the time to digital converter 100, n trigger signals TRG1 to TRGn and the clock signal CLK are input; n is an integer equal to or larger than 2. Time events of the trigger signals TRG1 to TRGn arrive in this order at an interval equal to or longer than a predetermined time.

The state transition section 10A or the state transition section 10B starts state transition based on the respective trigger signals TRG1 to TRGn and outputs state signals having the signal q[m:0] and the signal D[n:0].

The transition-state acquisition section 20A or the transition-state acquisition section 20B latches and holds, in synchronization with the time event of the clock signal CLK, the respective state signals having the signal q[m:0] and the signal D[n:0] in order and outputs state signals having the signal Q[m:0] and the signal S[n:0]. The respective state signals having the signal Q[m:0] and the signal S[n:0] are input to the arithmetic operation section 30.

The arithmetic operation section 30 calculates the number of state transition times based on the respective state signals having the signal Q[m:0] and the signal S[n:0], weights the number of state transition times based on time elapsing, and accumulates the weighted number of state transition times to calculate n time digital values TD1 to TDn. The arithmetic operation section 30 calculates m time digital values TDY1 to TDYm, which are respectively differences between any two of the time digital values TD1 to TDn; m is an integer equal to or larger than 1.

Figure 20:
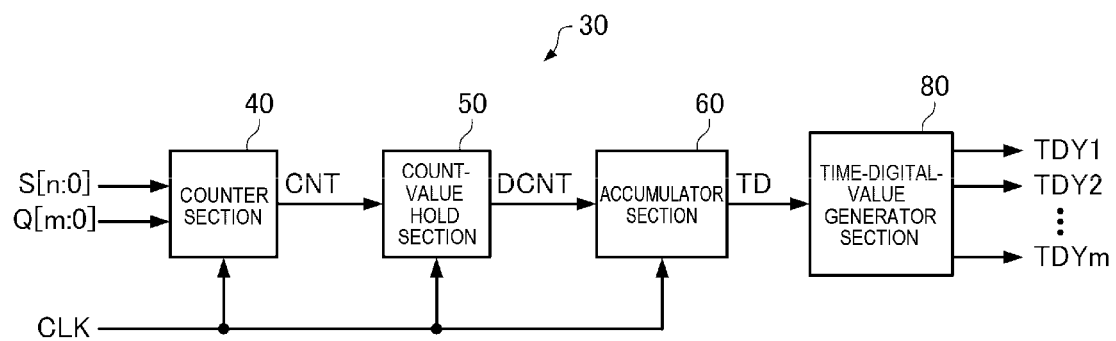
FIG. 20 is a diagram showing a configuration example of the arithmetic operation section.

FIG. 20 is a diagram showing a configuration example of the arithmetic operation section 30. As shown in FIG. 20, the arithmetic operation section 30 includes the counter section 40, the count-value hold section 50, the accumulator section 60, and a time-digital-value generator section 80.

When a time event of a trigger signal TRGi arrives, the counter section 40 outputs the count value CNT corresponding to the trigger signal TRGi; i is any integer equal to or larger than 1 and equal to or smaller than n. After the counter section 40 outputs the count value CNT corresponding to the trigger signal TRGi, the count value CNT held by the counter section 40 is initialized to 0. Thereafter, according to arrival of a time event of a trigger signal TRGi+1, the counter section 40 outputs the count value CNT corresponding to the trigger signal TRGi+1.

The count-value hold section 50 sequentially captures n count values CNT output from the counter section 40 in order and holds the n count values CNT as count values DCNT in synchronization with the clock signal CLK.

The accumulator section 60 sequentially accumulates, in synchronization with the clock signal CLK, the respective n count values DCNT held in order in the count-value hold section 50 to generate, in order, n time digital values TD corresponding to phase differences between the time event of the clock signal CLK and time events of the respective trigger signals TRG1 to TRGn. The count-value hold section 50 and the accumulator section 60 are initialized when a not-shown reset signal or the like is input.

The time-digital-value generator section 80 generates, in synchronization with the clock signal CLK, based on the n time digital values TD corresponding to the trigger signals TRG1 to TRGn, time digital values TDY1 to TDYm corresponding to a time interval between at least two time events of the trigger signals TRG1 to TRGn; m is an integer equal to or larger than 1. In other words, the time to digital converter 100 generates a time digital value TDY corresponding to a time interval between two time events from a difference between the time digital value TD corresponding to a time event of any one of the trigger signals TRG1 to TRGn and the time digital value TD corresponding to one of the other time events of the trigger signals TRG1 to TRGn.

For example, m=n−1. A time digital value TDYi may be a difference between the time digital value TD corresponding to the trigger signal TRGi+1 and the time digital value TD corresponding to the trigger signal TRGi.

The time-digital-value generator section 80 may perform predetermined scaling on the time digital values TDY1 to TDYm and output the time digital values TDY1 to TDYm or may convert the time digital values TDY1 to TDYm according to a predetermined conversion formula or table information and output the time digital values TDY1 to TDYm.

Any trigger signal TRGj among the trigger signals TRG1 to TRGn is an example of a "first trigger signal". Any other trigger signal TRGk among the trigger signals TRG1 to TRGn is an example of a "second trigger signal". A state signal output from the state transition section 10A or the state transition section 10B according to the trigger signal TRGj is an example of "first state information". A state signal output from the state transition section 10A or the state transition section 10B according to a trigger signal TRGk is an example of "second state information". The time digital value TD output from the accumulator section 60 according to the trigger signal TRGj is an example of a "first time digital value". The time digital value TD output from the accumulator section 60 according to the trigger signal TRGk is an example of a "second time digital value".

In this embodiment, the time event of the clock signal CLK is set independently from time events of the trigger signals TRG1 to TRGn. That is, the time event of the clock signal CLK and the time events of the trigger signals TRG1 to TRGn are asynchronous. The time digital values TDY1 to TDYm respectively correspond to a phase difference between any two time events among the time events of the trigger signals TRG1 to TRGn. For example, the time digital values TDY1 to TDYm are used as time stamps corresponding to a time interval between any two time events among the time events of the trigger signals TRG1 to TRGn.

With the time to digital converter 100 in the third embodiment explained above, the same effects as the effects of the time to digital converter 100 in the first embodiment or the time to digital converter 100 in the second embodiment are achieved. With the time to digital converter 100 in the third embodiment, the counter section 40, the count-value hold section 50, and the accumulator section 60 are shared for the trigger signals TRG1 to TRGn to generate the time digital values TDY1 to TDYm. Therefore, a reduction in the size of the time to digital converter 100 is possible.

3. A/D Conversion Circuit

3-1. First Embodiment

Figure 21:
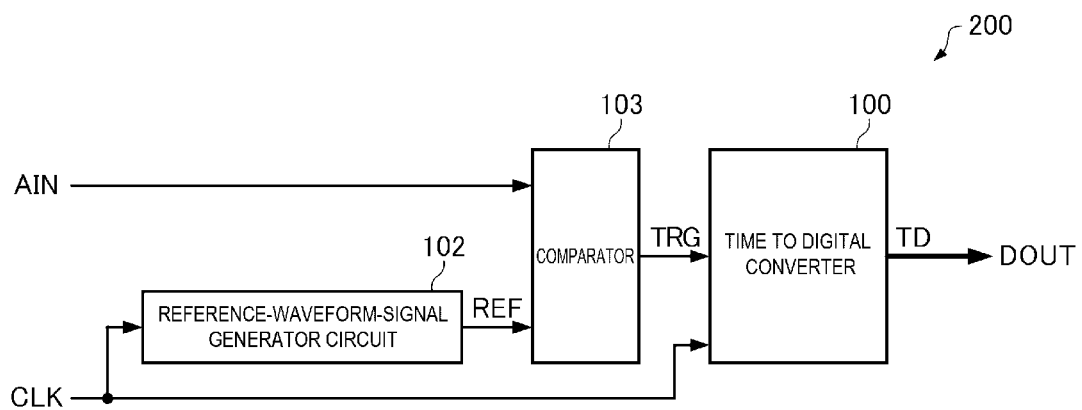
FIG. 21 is a diagram showing the configuration of an A/D conversion circuit in the first embodiment.

FIG. 21 is a diagram showing the configuration of an A/D conversion circuit 200 in the first embodiment. As shown in FIG. 21, the A/D conversion circuit 200 in the first embodiment includes a reference-waveform-signal generator circuit 102, a comparator 103, and the time to digital converter 100. The A/D conversion circuit 200 converts an input analog signal AIN into a digital signal DOUT and outputs the digital signal DOUT.

The reference-waveform-signal generator circuit 102 generates a reference waveform signal REF based on the clock signal CLK. The reference waveform signal REF is a signal, a voltage of which changes in the same cycle as the cycle of the clock signal CLK. The reference waveform signal REF may be, for example, a triangular wave signal, a ramp wave signal, a sine wave signal, or a cosine wave signal. The reference-waveform-signal generator circuit 102 may generate the reference waveform signal REF based on a signal obtained by dividing the clock signal CLK. In this case, the reference waveform signal REF may be a signal, a voltage of which changes in a cycle obtained by dividing the clock signal CLK. Since the reference waveform signal REF is generated based on the signal obtained by dividing the clock signal CLK and jitter of generation timing is suppressed, clocking accuracy in the time to digital converter 100 is improved. As a result, accuracy and resolution of A/D conversion are improved.

The comparator 103 compares a voltage of the analog signal AIN and a voltage of the reference waveform signal REF generated by the reference-waveform-signal generator circuit 102 and outputs the trigger signal TRG.

As explained above, the time to digital converter 100 calculates the time digital value TD corresponding to the phase difference between the time event of the clock signal CLK and the time event of the trigger signal TRG, that is, the time interval between the time event of the clock signal CLK and the time event of the trigger signal TRG.

The A/D conversion circuit 200 outputs the digital signal DOUT based on the time digital value TD. For example, the A/D conversion circuit 200 may output the digital signal DOUT as the digital signal DOUT having the time digital value TD or may convert the time digital value TD into the corresponding value having a linear relationship with the voltage of the analog signal AIN and output the corresponding value as the digital signal DOUT.

Figure 22:
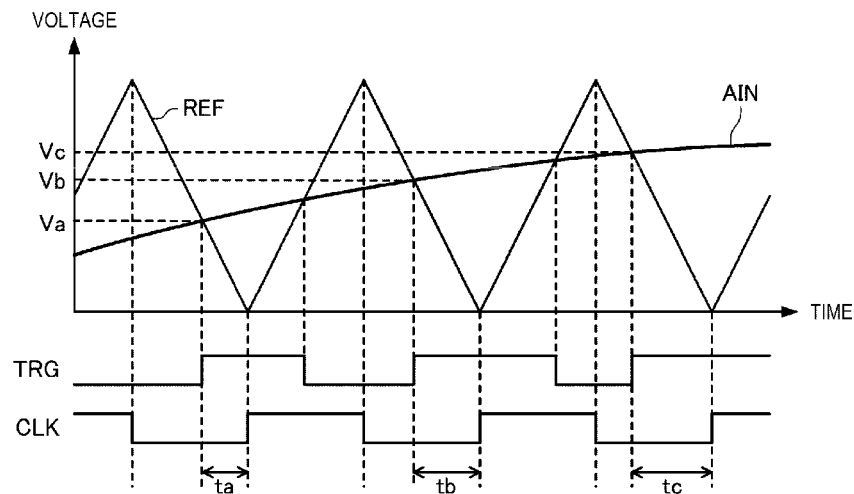
FIG. 22 is a diagram showing an example of waveforms of various signals in the A/D conversion circuit in the first embodiment.

FIG. 22 is a diagram showing an example of waveforms of various signals in the A/D conversion circuit 200 in the first embodiment. In the example shown in FIG. 22, the reference waveform signal REF is a triangular wave signal having the lowest voltage at the rising edge of the clock signal CLK and having the highest voltage at the falling edge of the clock signal CLK. The trigger signal TRG is at the high level if the voltage of the analog signal AIN is higher than the voltage of the reference waveform signal REF and is at the low level if the voltage of the analog signal AIN is lower than the voltage of the reference waveform signal REF.

In the example shown in FIG. 22, time intervals between the rising edges of the trigger signal TRG and the rising edges of the clock signal CLK at the time when the value of the voltage of the analog signal AIN is Va, Vb, and Vc are respectively ta, tb, and tc. The time intervals are ta<tb<tc with respect to Va<Vb<Vc. A time interval between the rising edge of the clock signal CLK and the rising edge of the trigger signal TRG linearly changes with respect to the voltage of the analog signal AIN. Therefore, the A/D conversion circuit 200 can output the digital signal DOUT as the digital signal DOUT having the time digital values TD corresponding to ta, tb, and tc.

With the A/D conversion circuit 200 in the first embodiment, high accuracy, high resolution, high-speed processing, low power consumption, a reduction in size, and the like can be realized by using the time to digital converter 100.

3-2. Second Embodiment

Figure 23:
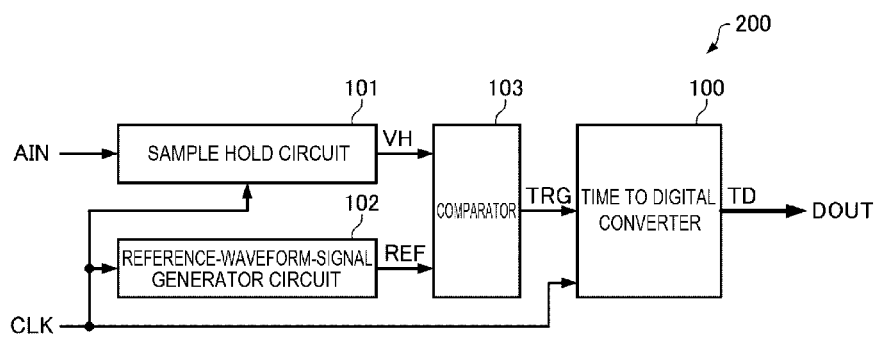
FIG. 23 is a diagram showing the configuration of an A/D conversion circuit in the second embodiment.

FIG. 23 is a diagram showing the configuration of the A/D conversion circuit 200 in the second embodiment. As shown in FIG. 23, the A/D conversion circuit 200 in the second embodiment includes a sample hold circuit 101, the reference-waveform-signal generator circuit 102, the comparator 103, and the time to digital converter 100. The A/D conversion circuit 200 converts the input analog signal AIN into the digital signal DOUT and outputs the digital signal DOUT.

The sample hold circuit 101 samples and holds a voltage of the analog signal AIN in synchronization with the clock signal CLK.

The reference-waveform-signal generator circuit 102 generates the reference waveform signal REF based on the clock signal CLK. The reference waveform signal REF is a signal, a voltage of which changes in the same cycle as the cycle of the clock signal CLK. The reference waveform signal REF may be, for example, a triangular wave signal, a ramp wave signal, a sine wave signal, or a cosine wave signal. The reference-waveform-signal generator circuit 102 may generate the reference waveform signal REF based on a signal obtained by dividing the clock signal CLK. In this case, the reference waveform signal REF may be a signal, a voltage of which changes in a cycle obtained by dividing the clock signal CLK. Since the reference waveform signal REF is generated based on the signal obtained by dividing the clock signal CLK and jitter of generation timing is suppressed, clocking accuracy in the time to digital converter 100 is improved. As a result, accuracy and resolution of A/D conversion are improved.

The comparator 103 compares a voltage VH held by the sample hold circuit 101 and a voltage of the reference waveform signal REF generated by the reference-waveform-signal generator circuit 102 and outputs the trigger signal TRG.

As explained above, the time to digital converter 100 calculates the time digital value TD corresponding to the phase difference between the time event of the clock signal CLK and the time event of the trigger signal TRG, that is, the time interval between the time event of the clock signal CLK and the time event of the trigger signal TRG.

The A/D conversion circuit 200 outputs the digital signal DOUT based on the time digital value TD. For example, the A/D conversion circuit 200 may output the digital signal DOUT as the digital signal DOUT having the time digital value TD or may convert the time digital value TD into the corresponding value having a linear relationship with the voltage of the analog signal AIN and output the corresponding value as the digital signal DOUT.

Figure 24:
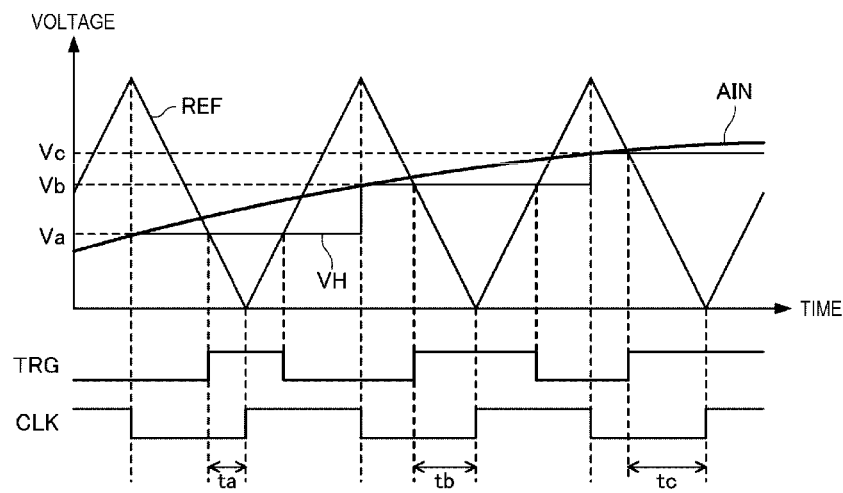
FIG. 24 is a diagram showing an example of waveforms of various signals in the A/D conversion circuit in the second embodiment.

FIG. 24 is a diagram showing an example of waveforms of various signals in the A/D conversion circuit 200 in the second embodiment. In the example shown in FIG. 24, a voltage of the analog signal AIN is sampled and held at each rising edge of the clock signal CLK. The reference waveform signal REF is a triangular wave signal having the lowest voltage at the rising edge of the clock signal CLK and having the highest voltage at the falling edge of the clock signal CLK. The trigger signal TRG is at the high level if the voltage VH is higher than the voltage of the reference waveform signal REF and is at the low level if the voltage VH is lower than the voltage of the reference waveform signal REF.

In the example shown in FIG. 24, when values of the voltage VH, in which the voltage of the analog signal AIN is held, are Va, Vb, and Vc, time intervals between the rising edges of the clock signal CLK and the rising edges of the trigger signal TRG are respectively ta, tb, and tc. The time intervals are ta<tb<tc with respect to Va<Vb<Vc. A time interval between the rising edge of the clock signal CLK and the rising edge of the trigger signal TRG varies linearly with the voltage of the analog signal AIN. Therefore, the A/D conversion circuit 200 can output the digital signal DOUT as the digital signal DOUT having the time digital values TD corresponding to ta, tb, and tc.

With the A/D conversion circuit 200 in the second embodiment, high accuracy, high resolution, high-speed processing, low power consumption, a reduction in size, and the like can be realized by using the time to digital converter 100. With the A/D conversion circuit 200 in the second embodiment, since sample timing can be kept constant by the sample hold circuit 101, it is possible to reduce jitter of A/D conversion timing.

The present disclosure is not limited to the embodiments. Various modified implementations of the present disclosure are possible within the scope of the gist of the present disclosure.

The embodiments and the modifications explained above are examples. The present disclosure is not limited to the embodiments and the modifications. For example, the embodiments and the modifications can be combined as appropriate.

The present disclosure includes substantially the same configuration as the configuration explained in the embodiments (for example, a configuration, a function, a method, and a result of which are the same as those in the embodiments or a configuration, a purpose, and an effect of which are the same as those in the embodiments). The present disclosure includes a configuration in which a nonessential portion of the configuration explained in the embodiments is replaced. The present disclosure includes a configuration that can accomplish the same action effects as the action effects explained in the embodiments or a configuration that can achieve the same purpose as the purpose of the embodiments. The present disclosure includes a configuration in which a publicly-known technique is added to the configuration explained in the embodiments.

What is claimed is:
1. A delay circuit comprising:
   a state transition section configured to start state transition, in which an internal state transitions, based on a trigger signal and output state information indicating the internal state; and
   a transition-state acquisition section configured to latch and hold the state information based on a latch signal, wherein
   the state transition section includes:
      a tapped delay line in which a plurality of delay elements are coupled;
      a logical circuit configured to generate a third signal based on a first signal and a second signal; and
      a synchronous transition section configured to count an edge of the third signal,
   the first signal is a signal based on the trigger signal,
   the second signal is any one of signals output from the plurality of delay elements,
   the state information is having a signal output from the synchronous transition section and a signal output from the tapped delay line,
   a humming distance of the state information before and after the state transition is 1, and
   a time from when the internal state transitions from a first internal state to a second internal state until when the internal state transitions to the first internal state again is longer than an interval of a time for updating the state information held by the transition-state acquisition section.

2. A time to digital converter comprising:
the delay circuit according to claim 1; and
an arithmetic operation section configured to calculate a number of state transition times of the state transition section based on the state information, weight the number of state transition times based on time elapsing, and accumulate the weighted number of state transition times to calculate a time digital value.

3. The time to digital converter according to claim 2, wherein, when a number of times the internal state of the state transition section transitions exceeds a threshold from when the trigger signal is input to the state transition section until when the transition-state acquisition section latches the state information, the arithmetic operation section calculates the time digital value assuming that the number of times is the threshold.

4. The time to digital converter according to claim 2, wherein
the trigger signal is a first trigger signal,
the state information is first state information,
the time digital value is a first time digital value,
the state transition section starts the state transition based on a second trigger signal and outputs second state information indicating the internal state,
the transition-state acquisition section latches and holds the second state information, and
the arithmetic operation section calculates a number of state transition times of the state transition section based on the second state information, weights the number of state transition times based on time elapsing, and accumulates the weighted number of state transition times to calculate a second time digital value and calculates a difference between the first time digital value and the second time digital value.

5. An A/D conversion circuit that converts an input analog signal into a digital signal and outputs the digital signal, the A/D conversion circuit comprising:
the time to digital converter according to claim 2;
a reference-waveform-signal generator circuit configured to generate a reference waveform signal based on the latch signal; and
a comparator configured to compare a voltage of the analog signal and a voltage of the reference waveform signal and output the trigger signal, wherein
the A/D conversion circuit outputs the digital signal based on the time digital value calculated by the time to digital converter.

6. An A/D conversion circuit that converts an input analog signal into a digital signal and outputs the digital signal, the A/D conversion circuit comprising:
the time to digital converter according to claim 2;
a sample hold circuit configured to sample and hold a voltage of the analog signal;
a reference-waveform-signal generator circuit configured to generate a reference waveform signal based on the latch signal; and
a comparator configured to compare a voltage held by the sample hold circuit and a voltage of the reference waveform signal and output the trigger signal, wherein
the A/D conversion circuit outputs the digital signal based on the time digital value calculated by the time to digital converter.

* * * * *